(12) United States Patent
Cho et al.

(10) Patent No.: US 9,171,932 B2
(45) Date of Patent: Oct. 27, 2015

(54) DISPLAY PANEL AND METHOD OF MANUFACTURING THE SAME

(71) Applicant: Samsung Display Co., Ltd., Yongin (KR)

(72) Inventors: Se-Hyoung Cho, Hwaseong-si (KR); Chong-Chul Chai, Seoul (KR); Mee-Hye Jung, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 83 days.

(21) Appl. No.: 13/951,992

(22) Filed: Jul. 26, 2013

(65) Prior Publication Data
US 2014/0291683 A1   Oct. 2, 2014

(30) Foreign Application Priority Data
Mar. 28, 2013 (KR) .................. 10-2013-0033162

(51) Int. Cl.
- *H01L 29/786* (2006.01)
- *H01L 29/66* (2006.01)
- *H01L 29/417* (2006.01)
- *H01L 27/12* (2006.01)

(52) U.S. Cl.
CPC ........ *H01L 29/66742* (2013.01); *H01L 27/124* (2013.01); *H01L 27/1222* (2013.01); *H01L 27/1248* (2013.01); *H01L 29/41733* (2013.01); *H01L 27/1225* (2013.01)

(58) Field of Classification Search
USPC ....................................... 257/59; 438/34, 158
See application file for complete search history.

(56) References Cited

U.S. PATENT DOCUMENTS

| | | | |
|---|---|---|---|
| 5,721,164 A * | 2/1998 | Wu | 438/159 |
| 5,811,318 A | 9/1998 | Kweon | |
| 6,265,249 B1 * | 7/2001 | Wu | 438/158 |
| 6,791,651 B2 | 9/2004 | Jo et al. | |
| 7,023,419 B2 | 4/2006 | Park | |
| 7,700,949 B2 | 4/2010 | Song et al. | |
| 7,977,128 B2 | 7/2011 | Cho et al. | |
| 8,094,274 B2 | 1/2012 | Tanaka et al. | |
| 8,168,980 B2 * | 5/2012 | Tsubata et al. | 257/72 |
| 8,309,960 B2 * | 11/2012 | Toyota et al. | 257/59 |

FOREIGN PATENT DOCUMENTS

| | | |
|---|---|---|
| JP | 10-010572 | 1/1998 |
| JP | 2011-199293 | 10/2011 |
| KR | 10-2002-0053459 | 7/2002 |

(Continued)

*Primary Examiner* — Lex Malsawma
(74) *Attorney, Agent, or Firm* — H.C. Park & Associates, PLC

(57) ABSTRACT

A display panel includes a gate line, a gate electrode, a planarization layer, a gate insulation layer, an active layer, a data line, a source electrode, a drain electrode, and a pixel electrode. The gate electrode extends from the gate line. The planarization layer covers the gate line and the gate electrode to have an opening exposing a portion of the gate electrode formed therethrough. The gate insulation layer covers a portion of the gate electrode exposed by the opening and the planarization layer. The active layer is formed on the gate insulation layer and corresponds to the gate electrode. The data line is formed. The source electrode extends from the data line to cover a portion of the opening. The drain electrode is spaced apart from the source electrode and covers a portion of the opening. The pixel electrode is connected to the drain electrode.

18 Claims, 21 Drawing Sheets

(56) References Cited

FOREIGN PATENT DOCUMENTS

| KR | 10-2004-0070989 | 8/2004 |
| KR | 10-2006-0087725 | 8/2006 |
| KR | 10-0635945 | 10/2006 |

* cited by examiner

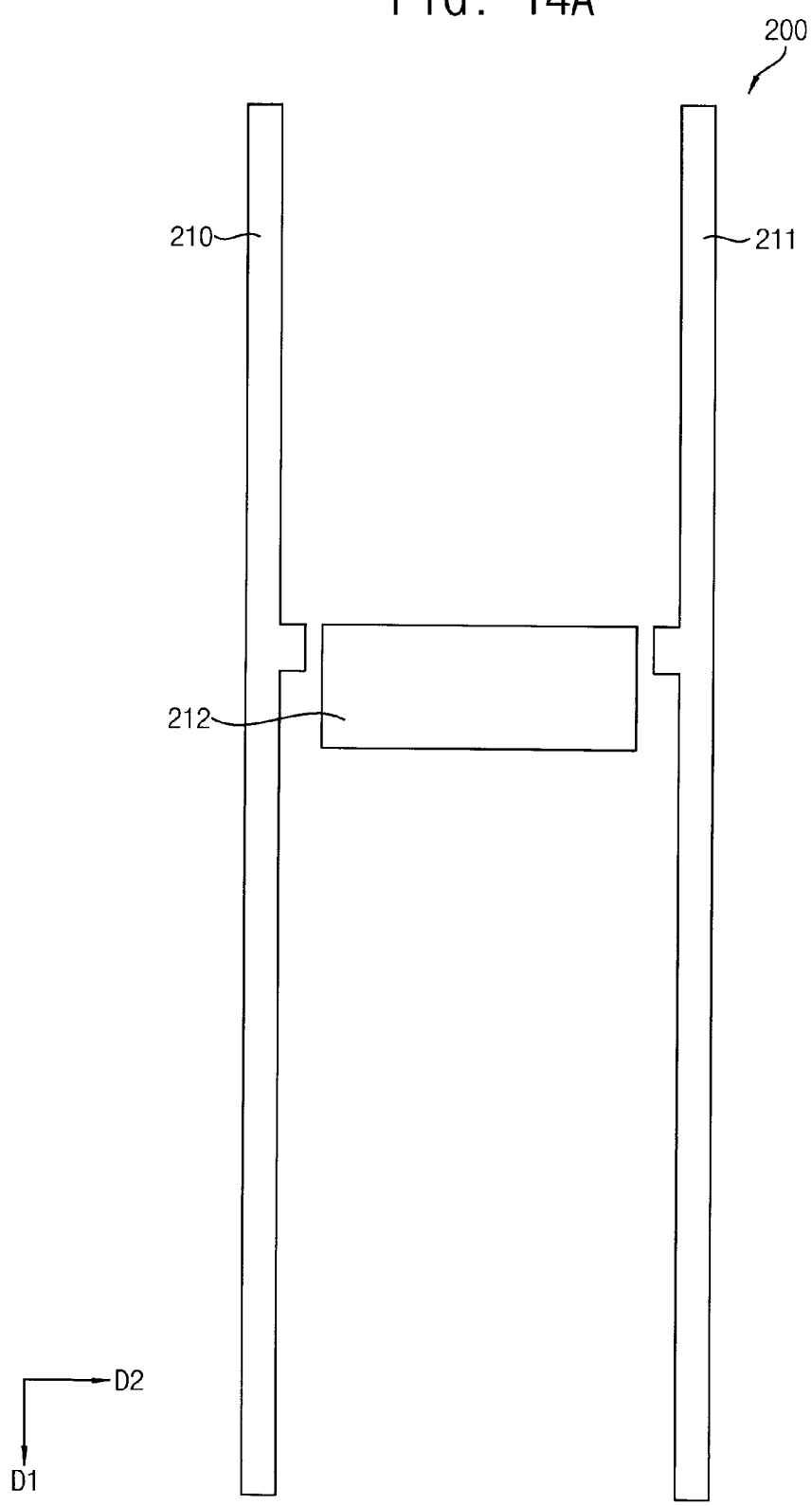

DISPLAY PANEL AND METHOD OF MANUFACTURING THE SAME

CROSS-REFERENCE TO RELATED APPLICATION

This application claims priority from and the benefit of Korean Patent Application No. 10-2013-0033162, which is hereby incorporated by reference for all purposes as if fully set forth herein.

BACKGROUND

1. Field

Exemplary embodiments of the present invention relate to a display panel and a method of manufacturing the display panel. More particularly, exemplary embodiments of the present invention relate to a display panel and a method of manufacturing the display panel that prevents a reduction in quality of a display even though a size of the display panel has been increased.

2. Discussion of the Background

Generally, a liquid crystal display ("LCD") controls light transmittance of liquid crystal cells arranged in a matrix pattern in response to video signals, thereby displaying a picture corresponding to the video signals on the liquid crystal display panel.

To accomplish this, the LCD includes an active area having liquid crystal cells arranged in an active matrix and driving circuits for driving the liquid crystal cells in the active area. More specifically, the LCD includes upper and lower plates. A plurality of thin film transistors (TFTs) for switching the liquid crystal cells, driving circuits for driving the thin film transistors, and signal lines connected between the driving circuits and the TFTs may be mounted on the lower substrate. The upper plate may be provided with color filters that are separated for each cell area by black matrix stripes in correspondence with the matrix liquid crystal cells and transparent electrodes coated on the color filters, and spacers provided between the upper and lower plates to maintain a constant cell gap. A liquid crystal is filled in a space defined between the upper and lower plates by the spacers.

Such an LCD is fabricated by separately preparing the upper plate and the lower plate. After the two plates are attached to each other, a liquid crystal is injected between the plates through a liquid crystal injection hole. Thereafter, the LCD is completed by coating the liquid crystal injection hole with a sealant and curing the sealant. The driving circuits require a plurality of driving integrated circuits ("D-IC") connected to a plurality of data lines and gate lines to apply data signals and a scanning signal to the data lines and the gate lines, respectively.

Because the LCD is capable of realizing a large scale and a high resolution, a display speed of the liquid crystal display panel may be reduced because the time required for allowing the D-IC to conduct all the TFTs is increased. For this reason, when a gate voltage level is set to be too high, a voltage drop occurs from a pixel as a result of a feed-through phenomenon, upon turning off the gate voltage, thereby causing distortion in picture quality.

SUMMARY

Exemplary embodiments of the present invention provide a display panel capable of preventing a display quality from being reduced even though a size of the display panel has been increased.

Exemplary embodiments of the present invention also provide a method of manufacturing the above-mentioned display panel.

Additional features of the invention will be set forth in the description which follows, and in part will be apparent from the description, or may be learned by practice of the invention.

An exemplary embodiment of the present invention discloses a display panel including a gate line, a gate electrode, a planarization layer, a gate insulation layer, an active layer, a data line, a source electrode, a drain electrode, and a pixel electrode. The gate line is disposed on a base substrate in a first direction. The gate electrode extends from the gate line. The planarization layer covers the gate line and the gate electrode and has an opening exposing a portion of the gate electrode formed therethrough. The gate insulation layer covers a portion of the gate electrode exposed by the opening and the planarization layer. The active layer is disposed on the gate insulation layer and corresponds to the gate electrode. The data line is disposed in a second direction. The source electrode extends from the data line and covers a portion of the opening. The drain electrode is spaced apart from the source electrode to cover a portion of the opening. The pixel electrode is connected to the drain electrode.

An exemplary embodiment of the present invention also discloses a method of manufacturing a display panel. In the method, a data line is formed in a first direction on a base substrate, and a gate electrode spaced apart from the data line is formed on the base substrate. A planarization layer is formed, which covers the data line and the gate electrode, and has a first opening exposing a portion of the gate electrode formed therethrough and a second opening exposing a portion of the data line. A gate insulation layer is formed on the planarization layer. An active layer is formed on the gate insulation layer. A lower gate line is formed on the gate insulation layer in parallel with a second direction, a source electrode is formed on the active layer and spaced apart from the lower gate line, a drain electrode is formed on the active layer and spaced apart from the source electrode and a storage electrode between the data lines adjacent to each other when viewed from a plan view. A first passivation layer is formed on the lower gate line, the source electrode, the drain electrode, and the storage electrode. An upper gate line is formed on the first passivation layer in parallel with the second direction and covers the lower gate line. A first connecting member is formed, which connects the data line and the source electrode exposed by the first opening and a second connecting member connecting the gate electrode and the lower gate line exposed by the second opening. A pixel electrode is formed and connected to the drain electrode.

An exemplary embodiment of the present invention also discloses a display panel including a data line, a gate electrode, a planarization layer, a gate insulation layer, an active layer, a lower gate line, a source electrode, a drain electrode, a storage electrode, a first passivation layer, an upper gate line, a first connecting member, a second connecting member, and a pixel electrode. A data line is disposed on a base substrate in a first direction. A gate electrode is disposed on the base substrate and spaced apart from the data line. A planarization layer covers the data line and the gate electrode and has a first opening exposing a portion of the gate electrode formed therethrough and a second opening exposing a portion of the data line. A gate insulation layer is disposed on the planarization layer. An active layer is disposed on the gate insulation layer. A lower gate line is disposed on the gate insulation layer in parallel with a second direction. A source electrode is disposed on the active layer and spaced apart from the lower gate line. A drain electrode is disposed on the active layer and spaced apart from the source electrode. A storage electrode is disposed between the data lines adjacent to each other when viewed from a plan view. A first passivation layer is disposed on the lower gate line, the source electrode, the drain electrode, and the storage electrode. An upper gate line is disposed on the first passivation layer in parallel with the second direction and covers the lower gate line. A first connecting member connects the data line and the source electrode exposed by the first opening. A second connecting member connects the gate electrode and the lower gate line exposed by the second opening. A pixel electrode is connected to the drain electrode.

An exemplary embodiment of the present invention also discloses another method of manufacturing a display panel. In the method, a data line is formed in a first direction on a base substrate, and a gate electrode spaced apart from the data line is formed on the base substrate. A planarization layer is formed which covers the data line and the gate electrode, and has a first opening exposing a portion of the gate electrode formed there through and a second opening exposing a portion of the data line. A gate insulation layer is formed on the planarization layer. An active layer is formed on the gate insulation layer. A lower gate line is formed on the gate insulation layer in parallel with a second direction, a source electrode is formed on the active layer to be spaced apart from the lower gate line, a drain electrode is formed on the active layer and spaced apart from the source electrode and a storage electrode between the data lines adjacent to each other when viewed from a plan view. A first passivation layer is formed on the lower gate line, the source electrode, the drain electrode, and the storage electrode. An upper gate line is formed on the first passivation layer in parallel with the second direction and covers the lower gate line. A first connecting member is formed, which connects the data line and the source electrode exposed by the first opening and a second connecting member connecting the gate electrode and the lower gate line exposed by the second opening. A pixel electrode is formed and is connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 14A, FIG. 14B, FIG. 14C, FIG. 14D, FIG. 14E, and FIG. 14F are plan views illustrating a manufacturing method of the thin-film transistor shown in FIG. 9.

DETAILED DESCRIPTION OF THE ILLUSTRATED EMBODIMENTS

Figure 1:
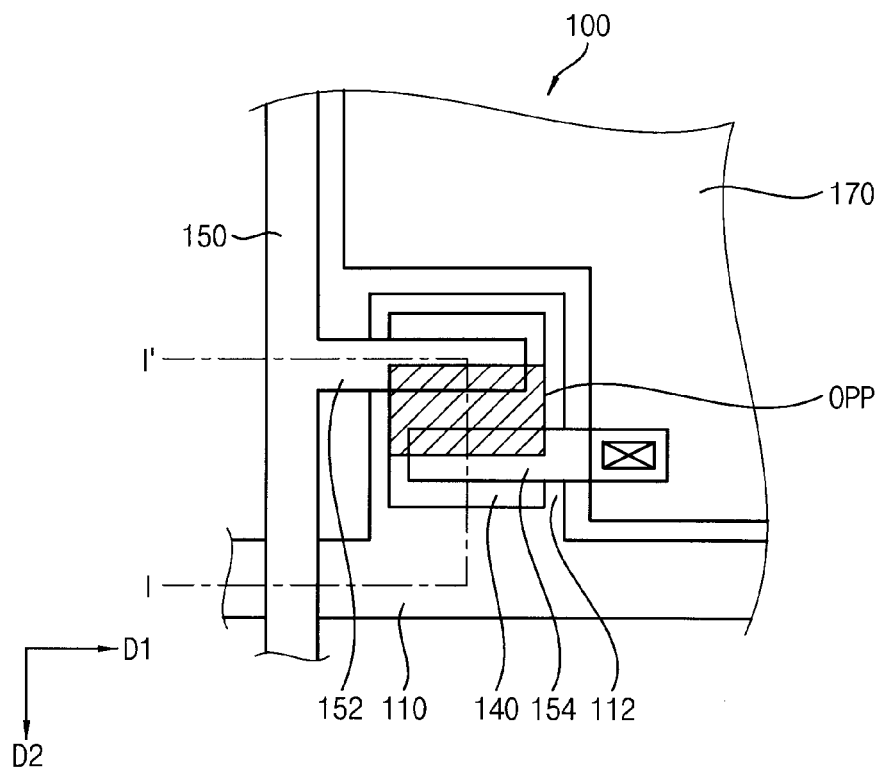
FIG. 1 is a plan view illustrating a display panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 2:
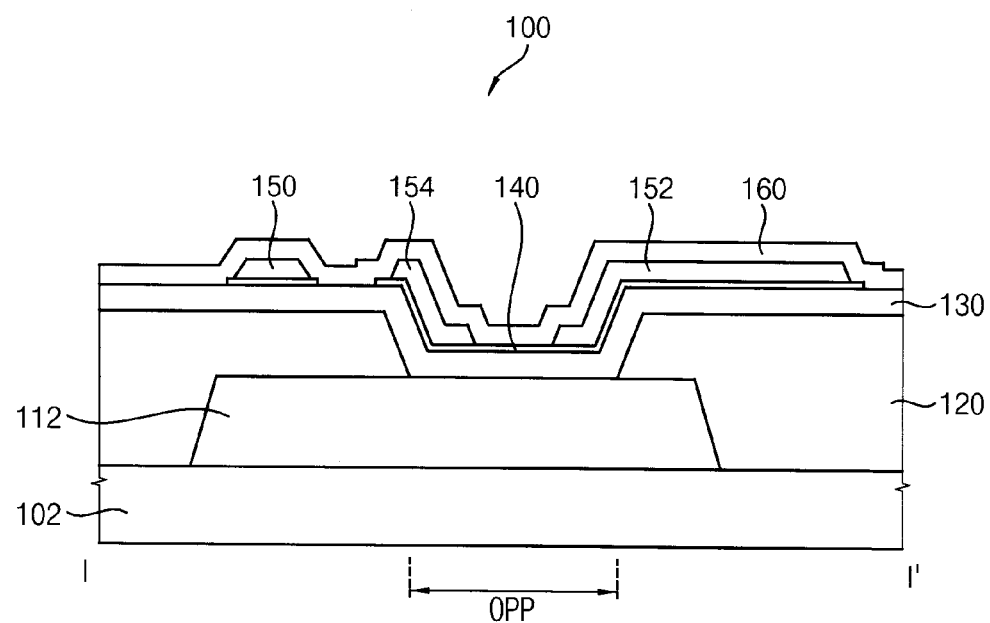
FIG. 2 is a cross-sectional view taken along the line I-I' of the thin-film transistor shown in FIG. 1.

FIG. 1 is a plan view illustrating a display panel 100 according to an exemplary embodiment of the present invention. FIG. 2 is a cross-sectional view taken along a line I-I' of a thin-film transistor shown in FIG. 1. In particular, a structure is shown in which a planarization layer 120 is formed in an area except for a thin-film transistor portion to decrease a parasitic capacitance corresponding to an overlap area between a gate electrode and source/drain electrodes.

Referring to FIGS. 1 and 2, a display panel 100 includes a base substrate 102, a gate line 110, a gate electrode 112, a planarization layer 120, a gate insulation layer 130, an active layer 140, a data line 150, a source electrode 152, a drain electrode 154, and a pixel electrode 170. In the present exemplary embodiment, the gate electrode 112, the active layer 140, a source electrode 152, and the drain electrode 154 may at least partially define one thin-film transistor.

The base substrate 102 may have a planar shape to provide an optically transparent property. The base substrate 102 may include a glass substrate or a plastic substrate.

The gate line 110 is formed on the base substrate 102 in a first direction D1, and the gate electrode 112 is extended from the gate line 110. The gate line 110 and the gate electrode 112 may include a metal having an electrically conductive material. The gate line 110 and the gate electrode 112 may be a single layer or comprise multiple layers, and may comprise at least one of aluminum (Al), copper (Cu), molybdenum (Mo), neodymium (Nd), titanium (Ti), platinum (Pt), silver (Ag), niobium (Nb), chrome (Cr), tungsten (W), tantalum (Ta), and the like, or a combination comprising at least one of the foregoing elements. The gate line 110 and the gate electrode 112 may include at least one of aluminum (Al), copper (Cu), molybdenum (Mo), neodymium (Nd), titanium (Ti), platinum (Pt), silver (Ag), niobium (Nb), chrome (Cr), tungsten (W), tantalum (Ta), or manganese (Mn), and the like, and may be a single layer or a multi-layered structure.

The planarization layer 120 covers the gate line 110 and the gate electrode 112 and has an opening OPP exposing a portion of the gate electrode 112. In the present exemplary embodiment, a size of the opening OPP is substantially smaller then a size of the active layer 140 overlapping with the gate electrode 112. In this case, a size of a first overlap area between the source electrode 152 and the active layer 140 disposed in the opening OPP is substantially equal to a size of a second overlap area between the drain electrode 154 and the active layer 140 disposed in the opening OPP.

The gate insulation layer 130 covers a portion of the gate electrode 112 exposed by the opening OPP and the planarization layer 120.

The active layer 140 is formed on the gate insulation layer 130 and corresponds to the gate electrode 112. For example, an oxide semiconductor material may be deposited on the gate insulation layer, and then the oxide semiconductor material may be patterned to form an active layer 140 of an oxide semiconductor. In this case, the active layer 140 is overlapped with at least a portion of the gate electrode 112 by interposing the gate insulation layer 130 therebetween.

A step forming the active layer 140 may include a step patterning a thin-film of an oxide semiconductor. In this case, the patterning step may be performed by one of a wet etching process and a dry etching process. In order to obtain a uniform thickness of the active layer 140, a dry etching process having anisotropy may be performed.

The active layer 140 may include an oxide semiconductor. The oxide semiconductor may include amorphous silicon, micro-crystallized silicon, single crystallized silicon, or mixtures thereof. The oxide semiconductor may include oxygen (O) and at least one of zinc (Zn), cadmium (Cd), gallium (Ga), indium (In), tin (Sn), hafnium (Hf), and zirconium (Zr). In this case, an empirical formula of the oxide semiconductor may be $A_xB_yC_zO$ (x, y, z≥0) (A, B and C are selected from Zn, Cd, Ga, In, Sn, Hf and Zr). Examples of the oxide semiconductors including at least one of the above-described materials may include ZnO, $InGaZnO_4$, ZnInO, ZnSnO, InZnHfO, SnInO, SnO, and ZnSnHfO, but are not limited thereto.

The data line 150 is formed along a second direction D2. The second direction D2 may cross the first direction D1. The data line 150 may include at least one material of Al, Cu, Mo, Nd, Ti, Pt, Ag, Nb, Cr, W, Ta, or Mn, and the like, and may be a single layer or a multi-layered structure.

The source electrode 152 is extended from the data line 150 to cover a portion of the opening OPP.

The drain electrode 154 is spaced apart from the source electrode 152 to cover a portion of the opening OPP.

The pixel electrode 170 is connected to the drain electrode 154. Various known techniques for connecting the pixel electrode 170 and the drain electrode 154 may be applied, and thus a detailed description thereof is omitted here.

As described above, according to the present exemplary embodiment, the planarization layer 120 is disposed in an area where the gate electrode 112 is overlapped with a portion of the source electrode 152. Thus, a parasitic capacitance resulting from an overlapping of the gate electrode 112 and the source electrode 152 is decreased, so that a load of the gate line 110 and a load of the data line 150 may be decreased. The planarization layer 120 is disposed in an area where the gate electrode 112 is overlapped with a portion of the drain electrode 154. Thus, a parasitic capacitance resulting from an overlapping of the gate electrode 112 and the drain electrode 154 is decreased, so that a load of the gate line 110 may be decreased.

FIGS. 3A to 3D are cross-sectional views illustrating a manufacturing method of the thin-film transistor shown in FIG. 1.

Referring to FIGS. 1 to 3A, a first metal layer is deposited on a base substrate 102, and then the first metal layer is patterned through a photolithography process to form a gate line 110 and a gate electrode 112 extended from the gate line 110. In the photolithography process, a photoresist is formed on a base substrate 102, a light exposure is performed in a desired pattern by using an exposing device, and alkaline solution is used to etch away the first metal layer to form the desired pattern.

Figure 3A:
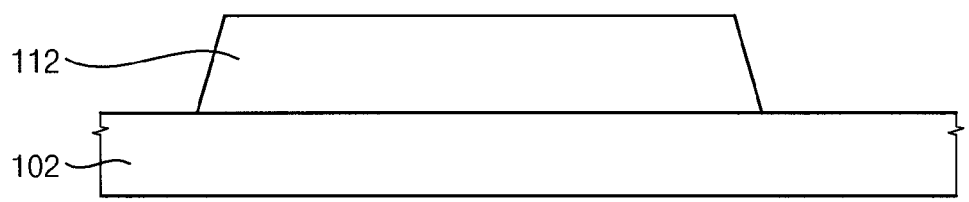
FIG. 3A, FIG. 3B, FIG. 3C, and FIG. 3D are cross-sectional views illustrating a manufacturing method of the thin-film transistor shown in FIG. 1.

Referring to FIGS. 1 to 3B, a planarization layer 120 is coated on the entire surface of the resultant structure of FIG. 3A, and then an opening OPP is formed through the planarization layer 120 by using an optical mask in order to expose a portion of the gate electrode 112. The planarization layer 120 may include an organic layer. Alternatively, the planarization layer 120 may include a material identical to the gate insulation layer 130.

The planarization layer 120 may be a negative photosensitive organic layer. When the planarization layer 120 includes a negative photosensitive organic layer, the optical mask may include a light-blocking portion for blocking light and a light-transmitting portion for transmitting light. The light-blocking portion may be positioned at a portion of the gate electrode 112.

Meanwhile, the planarization layer 120 may be a positive photosensitive organic layer. When the planarization layer 120 includes a positive photosensitive organic layer, the optical mask may include a light-blocking portion for blocking light and a light-transmitting portion for transmitting light. The light-transmitting portion may be positioned at a portion of the gate electrode 112.

In addition, heat processing may be performed after the opening OPP is formed through the planarization layer 120. The heat process may be performed at about 200 degrees Celsius to about 230 degrees Celsius for about a half hour to one hour.

Figure 3B:
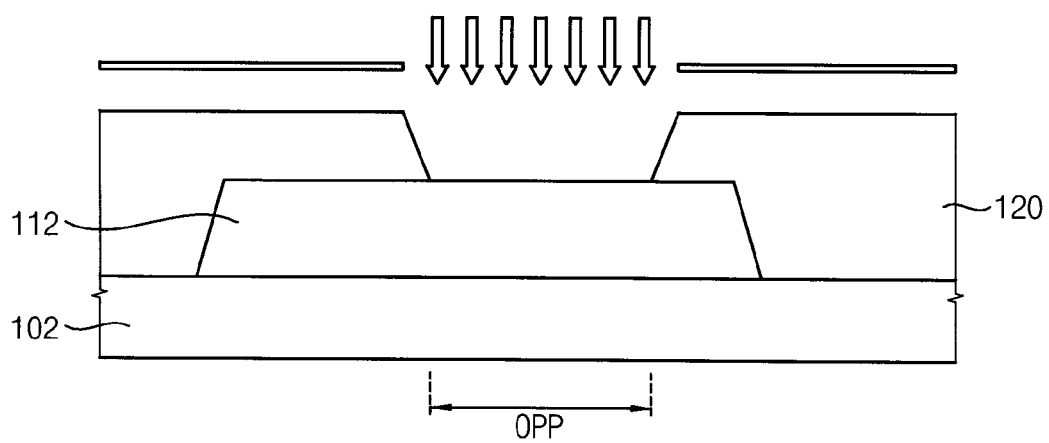

Referring to FIGS. 1 to 3C, a gate insulation layer 130 is formed on the entire surface of the resultant structure of FIG. 3B, and then an active layer 140 and a second metal layer are formed on the gate insulation layer 130. The gate insulation layer 130 may be formed thereon in order to cover the entire surface of the resultant structure of FIG. 4. Alternatively, the gate insulation layer 130 may be formed thereon in order to cover the gate line 110 and the gate electrode 112. The active layer 140 may be formed thereon in order to cover the entire surface of the gate insulation layer 130. Alternatively, the active layer 140 may be formed only in an area where it operates as an active layer 140 of a thin-film transistor. The second metal layer is patterned through a photolithography process, thereby forming a data line 150, a source electrode 152, and a drain electrode 154. The data line 150 is formed in parallel with a first direction D1, the source electrode 152 is extended from the data line 150, and the drain electrode 154 is spaced apart from the source electrode 152e.

Figure 3C:
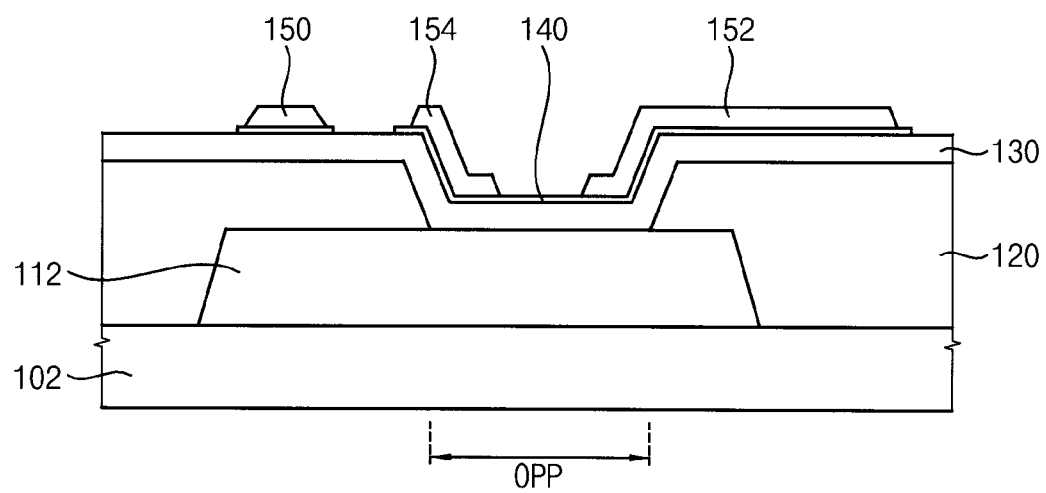
Figure 3D:
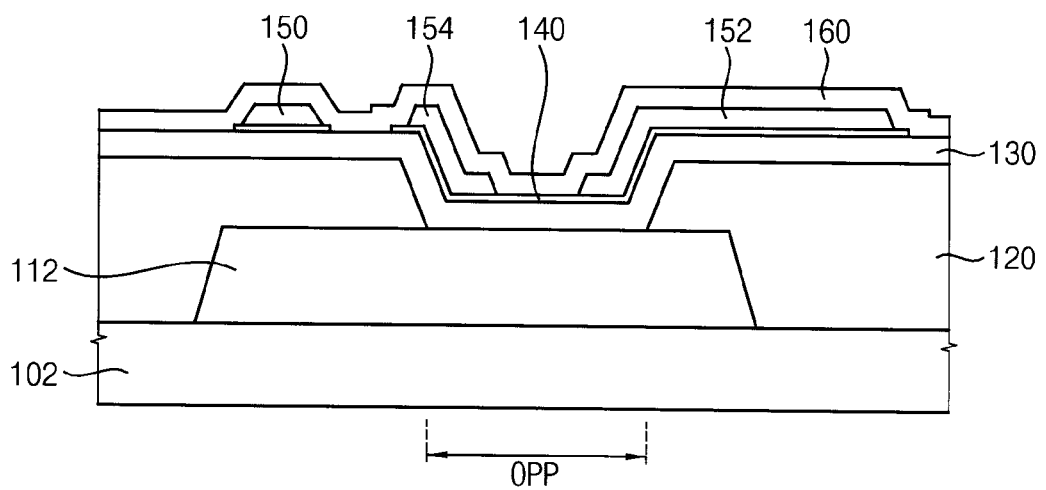

Referring to FIGS. 1 to 3D, a passivation layer 160 is formed on the entire surface of the resultant structure of FIG. 3C, and then a portion of the passivation layer 160 is opened to form a pixel electrode 170 (shown in FIG. 1) connected to the drain electrode 154. The passivation layer 160 may include a silicon oxide ($SiO_x$) or a silicon nitride ($SiN_x$), although other suitable insulation layers would also be within the scope of these embodiments.

When the source electrode 152 and the drain electrode 154 are formed on the gate electrode 112, misalignment may occur. The misalignment may vary a parasitic capacitance "Cgs" between a gate electrode and a source electrode. When the parasitic capacitance "Cgs" between gate and source electrodes is varied, display deterioration may be generated due to variation of a kickback voltage.

Conventionally, a kickback voltage is induced in a pixel voltage signal when a drain voltage signal is transmitted to the pixel electrode. The kickback voltage is determined by a parasitic capacitance "Cgs", a liquid crystal capacitance "CLC", a storage capacitance "CST", and a difference voltage "Δg" between gate voltage signals "Vg" (see the following Equation 1, where values of capacitance are in femtofarads ("fF" or $1\times10^{-15}$ F).

$$\Delta Vp = \frac{Cgs \Delta g}{Cgs + CLC + CST} \quad \text{[Equation 1]}$$

Thus, an opening OPP of the pixel electrode 160 is largely formed by a misalignment margin, so that it may prevent a parasitic capacitance between gate and source electrodes from being varied and thereby reduce a variation in kickback voltage.

Figure 4:
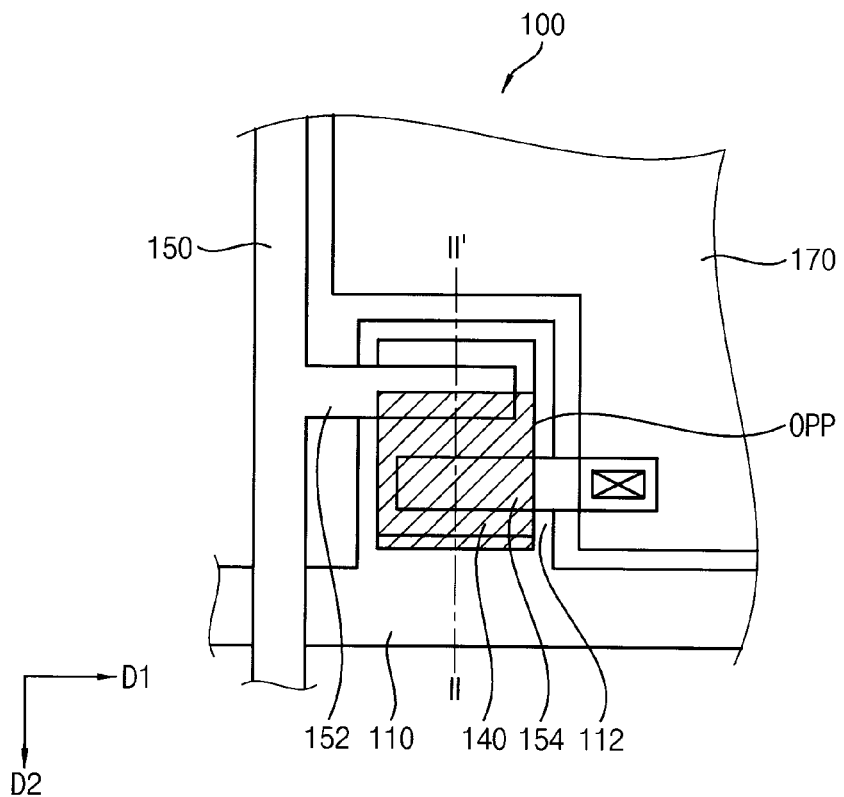
FIG. 4 is a plan view illustrating an example of a variation of the thin-film transistor shown in FIG. 1.
Figure 5:
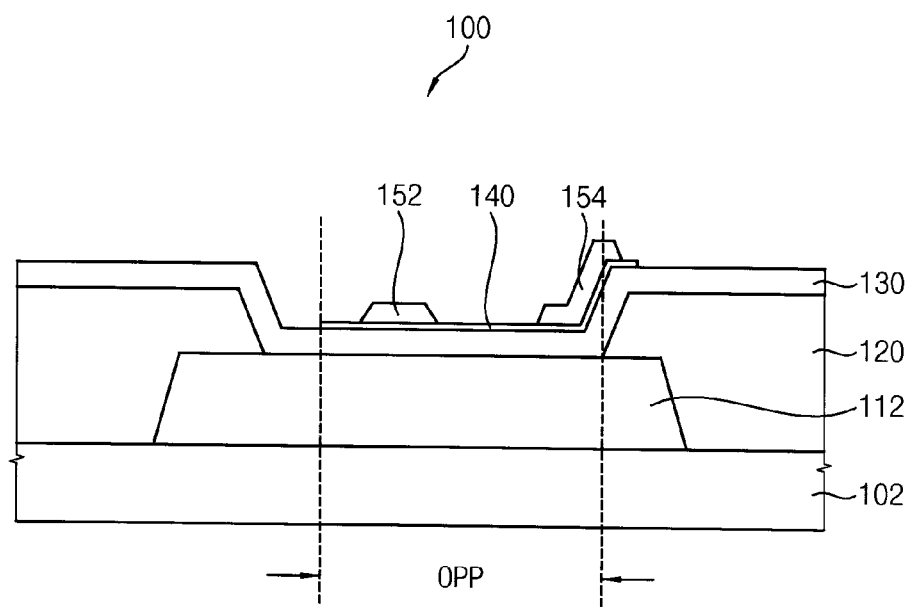
FIG. 5 is a cross-sectional view taken along the line II-II' of the thin-film transistor shown in FIG. 4.

FIG. 4 is a plan view illustrating an example of a variation of the thin-film transistor shown in FIG. 1. FIG. 5 is a cross-sectional view taken along the line II-II' of the thin-film transistor shown in FIG. 4. In particular, FIG. 4 shows that a size of an opening OPP corresponding to a drain electrode 154 is largely formed by a misalignment margin.

Referring to FIGS. 4 and 5, a display panel 100 includes a base substrate 102, a gate line 110, a gate electrode 112, a planarization layer 120, a gate insulation layer 130, an active layer 140, a data line 150, a source electrode 152, a drain electrode 154, and a pixel electrode 170. In the present exemplary embodiment, the gate electrode 112, the active layer 140, the source electrode 152 and the drain electrode 154 may at least partially define one thin-film transistor. Elements configuring a thin-film transistor shown in FIGS. 4 and 5 are substantially the same as elements configuring a thin-film transistor shown in FIGS. 1 and 2, except for the size of the opening OPP of the planarization layer 120. The same or like elements shown in FIGS. 4 and 5 have been labeled with the same reference characters as used above to describe the exemplary embodiment of the thin-film transistor shown in FIGS. 1 and 2, and any repetitive detailed description thereof will hereinafter be omitted or simplified.

In the present variation, a size of the opening OPP is substantially equal to that of an active layer 140 overlapped with the gate electrode 112. In this case, a size of a first overlapping area between the source electrode 152 and the active layer 140 disposed in the opening OPP is smaller than a size of a second overlapping area between the drain electrode 154 and the active layer 140 disposed in the opening OPP.

Table 1 is a table for explaining a difference in capacitance of a conventional thin-film transistor and a difference in capacitance of the thin-film transistor corresponding to the present invention.

TABLE 1

|  |  | Capacitance Difference (in units of fF) | | | | |
|---|---|---|---|---|---|---|
|  |  | 0 μm | Left-1.5 μm | | Right-1.5 μm | |
|  |  | Cgs | Cgs | ΔC % | Cgs | ΔC % |
| Conventional Structure (shown in FIG. 1) | Cgs_H | 6.69 | 7.66 | 14.44% | 5.57 | −16.77% |
|  | Cgs_L | 6.80 | 5.68 | −16.45% | 7.77 | 14.30% |
| Cgs variation preventing Structure (shown in FIG. 4) | Cgs_H | 7.75 | 7.76 | 0.02% | 7.76 | 0.06% |
|  | Cgs_L | 7.87 | 7.86 | −0.01% | 7.86 | −0.10% |

In Table 1, the conventional structure is a structure of a thin-film transistor having the opening OPP shown in FIG. 1, and the variation preventing structure is a structure of a thin-film transistor having the opening OPP shown in FIG. 4. In FIG. 1, the term "left-1.5 μm" means a viewing point is shifted to a left side of a cross-sectional view of FIG. 2 or FIG. 5 by about 1.5 μm and the term "right-1.5 μm" means a viewing point is shifted to a right side of a cross-sectional view of FIG. 2 or FIG. 5 by about 1.5 μm.

Referring to Table 1, when a misalignment of an opening OPP is not generated in the conventional structure, the maximum value Cgs_H of a parasitic capacitance Cgs between gate and source electrodes is about 6.69 fF, and the minimum value Cgs_L of a parasitic capacitance Cgs between gate and source electrodes is about 6.80 fF.

When a misalignment resulting from a shift to a left side of an opening OPP by about 1.5 μm is generated in the conventional structure, the maximum value Cgs_H of a parasitic capacitance Cgs between gate and source electrodes is about 7.66 Ff and the minimum value Cgs_L of a parasitic capacitance Cgs between gate and source electrodes is about 5.68 fF. Thus, a capacitance difference is about 14.44% with respect to the maximum value, and a capacitance difference is about −16.45% with respect to the minimum value.

When a misalignment resulting from a shift to a right side of an opening OPP by about 1.5 μm is generated in the conventional structure, the maximum value Cgs_H of a parasitic capacitance Cgs between gate and source electrodes is about 5.57 fF and the minimum value Cgs_L of a parasitic capacitance Cgs between gate and source electrodes is about 7.77 fF. Thus, a capacitance difference percentage is about −16.77% with respect to the maximum value, and a capacitance difference percentage is about 14.30% with respect to the minimum value.

When a misalignment of an opening OPP is not generated in the structure of a thin-film transistor according to the variation described above, the maximum value Cgs_H of a parasitic capacitance Cgs between gate and source electrodes is about 7.75 fF and the minimum value Cgs_L of a parasitic capacitance Cgs between gate and source electrodes is about 7.87 fF.

When a misalignment resulting from a shift to a left side of an opening OPP by about 1.5 µm is generated in the structure of a thin-film transistor according to the variation preventing structure described above, the maximum value Cgs_H of a parasitic capacitance Cgs between gate and source electrodes is about 7.76 fF and the minimum value Cgs_L of a parasitic capacitance Cgs between gate and source electrodes is about 7.86 fF. Thus, a capacitance percentage difference is about 0.02% with respect to the maximum value, and a capacitance percentage difference is about −0.01% with respect to the minimum value.

When a misalignment resulting from a shift to a right side of an opening OPP by about 1.5 µm is generated in the structure of a thin-film transistor according to the variation preventing structure described above, the maximum value Cgs_H of a parasitic capacitance Cgs between gate and source electrodes is about 7.76 fF and the minimum value Cgs_L of a parasitic capacitance Cgs between gate and source electrodes is about 7.86 fF. Thus, a capacitance percentage difference is about 0.06% with respect to the maximum value, and a capacitance percentage difference is about −0.10% with respect to the minimum value.

Thus, when a misalignment is generated with respect to an opening in the conventional structure, a large capacitance difference may be generated. However, when an opening is expanded with respect to the misalignment, the generation of a capacitance difference may be prevented.

Figure 6:
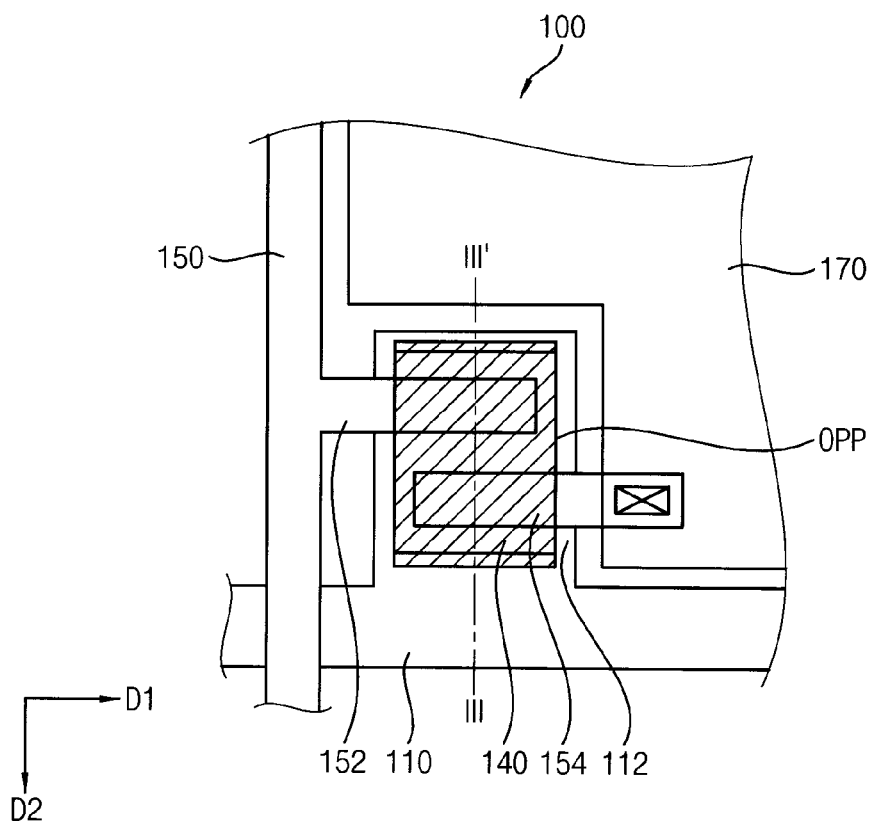
FIG. 6 is a plan view illustrating another example of the variation of the thin-film transistor shown in FIG. 1.
Figure 7:
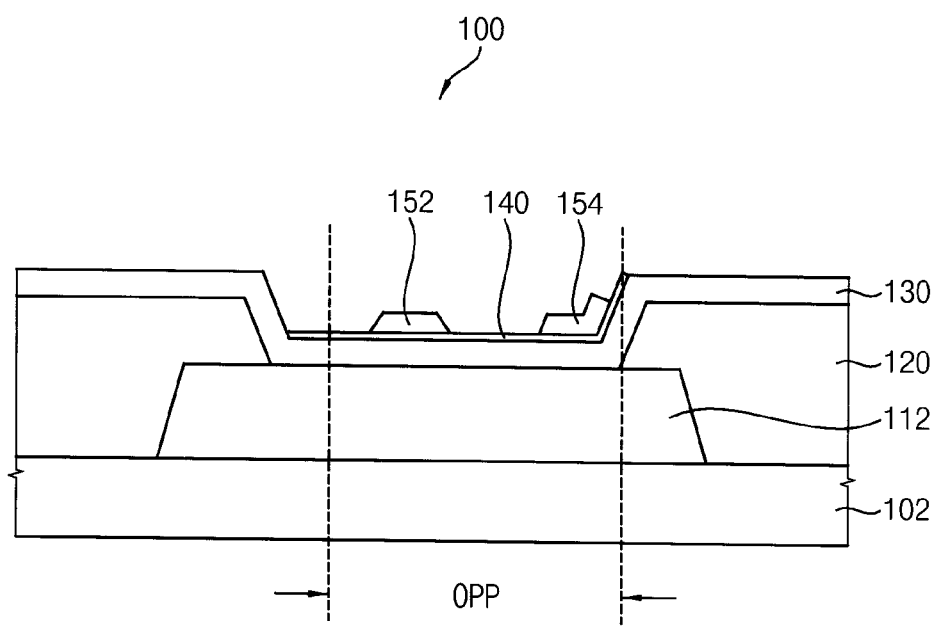
FIG. 7 is a cross-sectional view taken along the line III-III' of the thin-film transistor shown in FIG. 6.

FIG. 6 is a plan view illustrating an example of another variation of the thin-film transistor shown in FIG. 1. FIG. 7 is a cross-sectional view taken along the line III-III' of the thin-film transistor shown in FIG. 6. In particular, a structure for preventing a parasitic capacitance Cgs from being generated between gate and source electrodes is illustrated.

Referring to FIGS. 6 and 7, a display panel 100 includes a base substrate 102, a gate line 110, a gate electrode 112, a planarization layer 120, a gate insulation layer 130, an active layer 140, a data line 150, a source electrode 152, a drain electrode 154, and a pixel electrode 170. In the present exemplary embodiment, the gate electrode 112, the active layer 140, the source electrode 152 and the drain electrode 154 may define one thin-film transistor. Elements configuring a thin-film transistor shown in FIGS. 6 and 7 are substantially the same as elements configuring a thin-film transistor shown in FIGS. 1 and 2, except for an opening OPP of the planarization layer 120. The same or like elements shown in FIGS. 6 and 7 have been labeled with the same reference characters as used above to describe the exemplary embodiments of the thin-film transistor shown in FIGS. 1 and 2, and any repetitive detailed description thereof will hereinafter be omitted or simplified.

In the present variation embodiment, a size of the opening OPP is greater than that of the active layer 140 which is overlapped with the gate electrode 112. In this case, a size of a first overlap area between the source electrode 152 and the active layer 140 disposed in the opening OPP is substantially equal to that of a second overlap area between the drain electrode 154 and the active layer 140.

Figure 8:
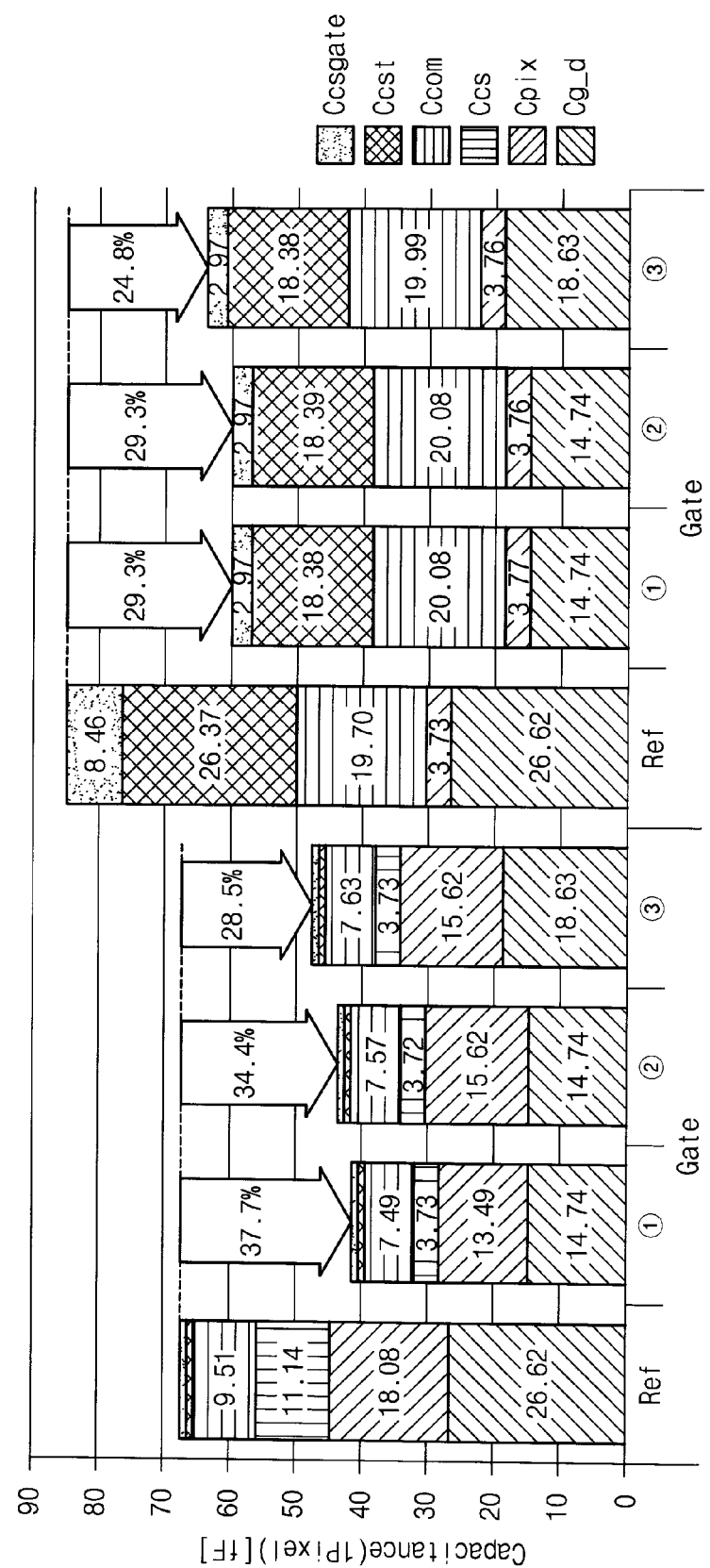
FIG. 8 is a graph schematically explaining gate load values and data load values corresponding to a reference thin-film transistor, the thin-film transistor of FIG. 1, the thin-film transistor of FIG. 4, and the thin-film transistor of FIG. 6, respectively.

FIG. 8 is a graph schematically explaining gate load values and data load values corresponding to a reference thin-film transistor, the thin-film transistor of FIG. 1, the thin-film transistor of FIG. 4, and the thin-film transistor of FIG. 6, respectively. In FIG. 8, Ccs gate is a capacitance between an upper common electrode and source and gate electrodes, Ccst is a capacitance between a storage electrode and a pixel electrode, and Ccom is a capacitance between an upper common electrode and a pixel electrode. Ccs is a capacitance between an upper common electrode and a source electrode, Cpix is a capacitance between a pixel electrode, and Cg_d is a capacitance between a gate electrode and a drain electrode. In FIG. 8, a reference thin-film transistor has a structure in which a planarization layer is omitted.

Referring to FIG. 8, Ccom, Ccs, Cpix and Cg_d of the reference thin-film transistor have capacitance values of about 9.51 fF, 11.14 fF, 18.08 fF, and 26.62 fF, respectively. Ccom, Ccs, Cpix and Cg_d of the thin-film transistor of FIG. 6 have capacitance values of about 9.51 fF, 11.14 fF, 18.08 fF, and 26.62 fF, respectively. Ccom, Ccs, Cpix and Cg_d of the thin-film transistor of FIG. 5 have capacitance values of about 9.51 fF, about 11.14 fF, about 18.08 fF, and about 26.62 fF, respectively.

Thus, a gate load value of the thin-film transistor shown in FIG. 1 may be decreased by about 37.7% in comparison with that of the reference thin-film transistor. A gate load value of the thin-film transistor shown in FIG. 6 may be decreased by about 34.4% in comparison with that of the reference thin-film transistor. A gate load value of the thin-film transistor shown in FIG. 5 may be decreased by about 28.5% in comparison with that of the reference thin-film transistor.

Ccsgate, Ccst, Ccom, Cpix and Cg_d of the reference thin-film transistor have capacitance values of about 8.46 fF, 26.37 fF, 19.70 fF, 3.73 fF, and 26.62 fF, respectively. Ccsgate, Ccst, Ccom, Cpix and Cg_d of the thin-film transistor of FIG. 6 have capacitance values of about 2.97 fF, 18.38 fF, 20.08 fF, 3.77 fF, and 14.74 fF, respectively. Ccsgate, Ccst, Ccom, Cpix and Cg_d of the thin-film transistor of FIG. 5 have capacitance values of about 2.97 fF, 18.38 fF, 19.99 fF, 3.76 fF, and t 18.63 fF, respectively.

Thus, a gate load value of the thin-film transistor shown in FIG. 1 may be decreased by about 29.37% in comparison with that of the reference thin-film transistor. A gate load value of the thin-film transistor shown in FIG. 6 may be decreased by about 29.3% in comparison with that of the reference thin-film transistor. A gate load value of the thin-film transistor shown in FIG. 5 is decreased by about 24.8% in comparison with that of the reference thin-film transistor.

Figure 9:
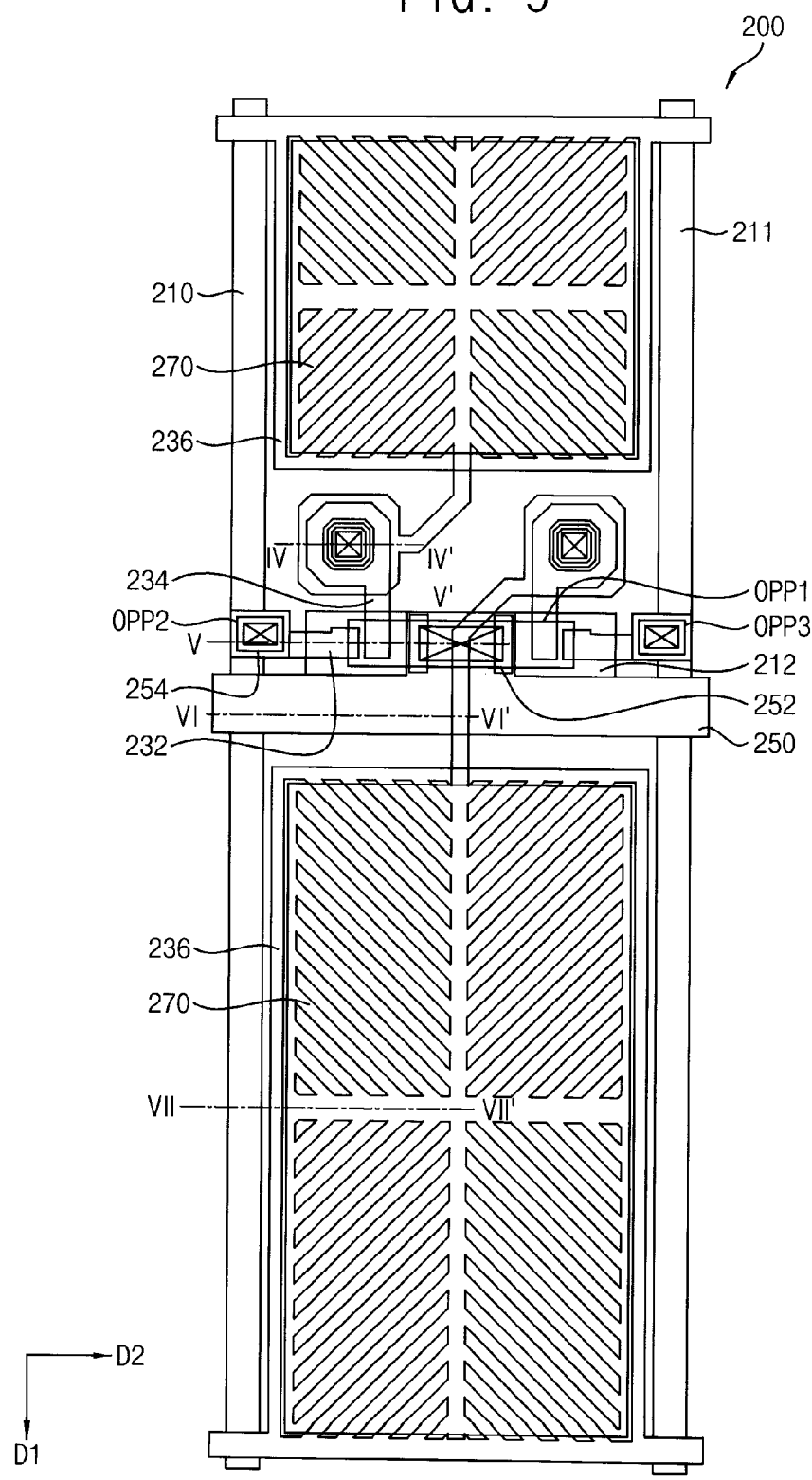
FIG. 9 is a plan view illustrating a display panel according to another exemplary embodiment of the present invention.
Figure 10:
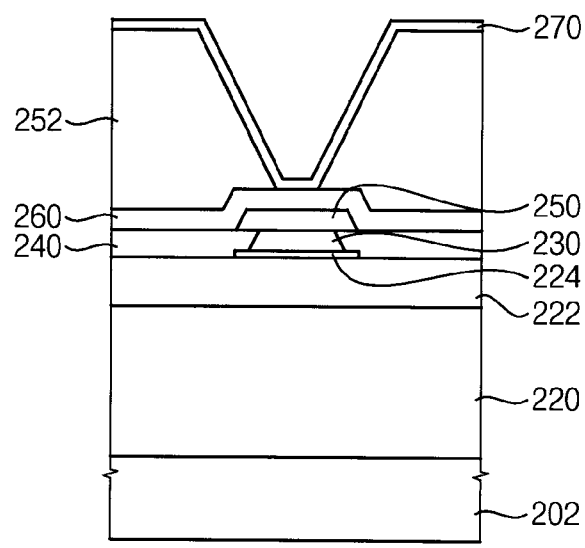
FIG. 10 is a cross-sectional view taken along the line IV-IV' of FIG. 9.
Figure 11:
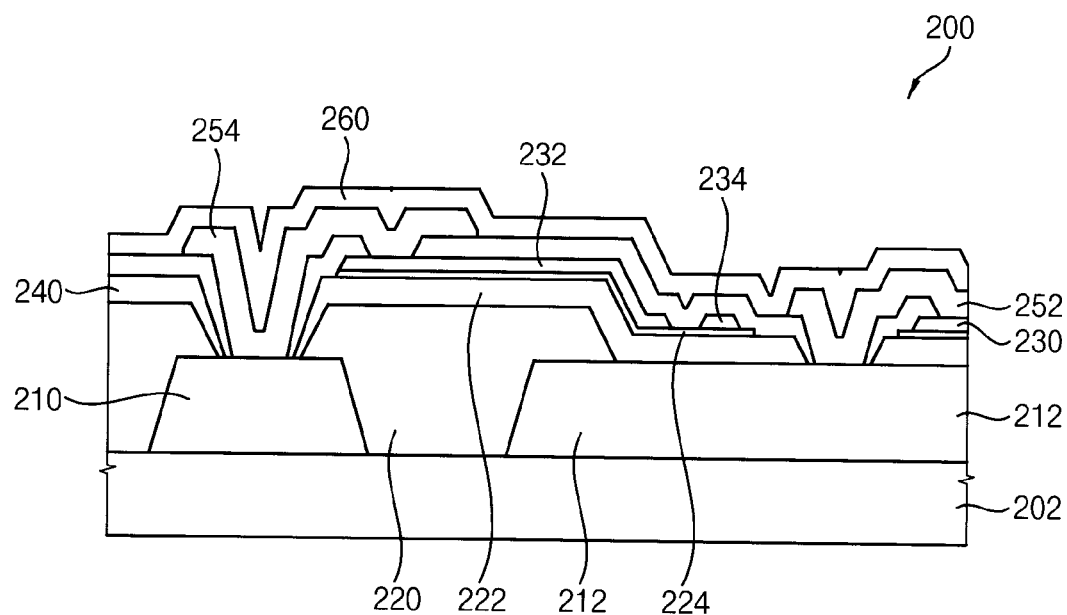
FIG. 11 is a cross-sectional view taken along the line V-V' of FIG. 9.
Figure 12:
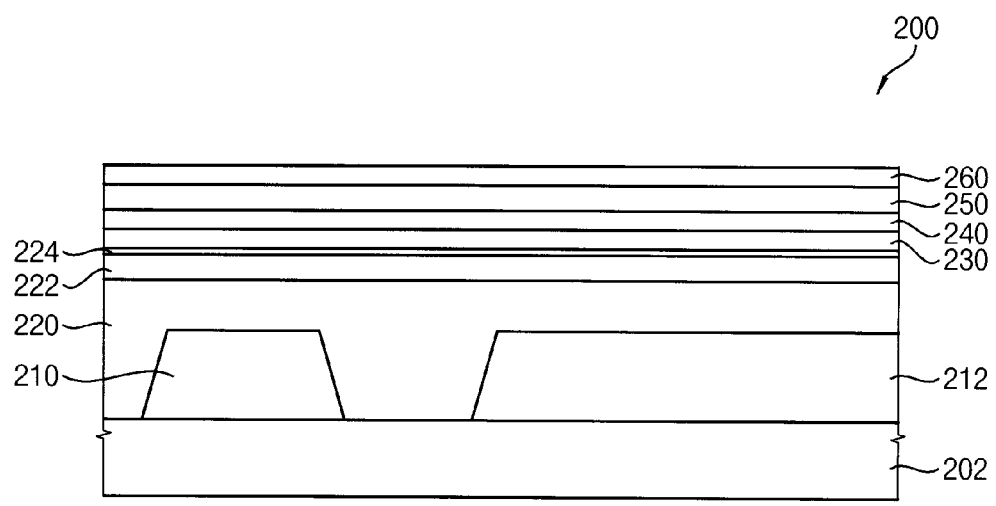
FIG. 12 is a cross-sectional view taken along the line VI-VI' of FIG. 9.
Figure 13:
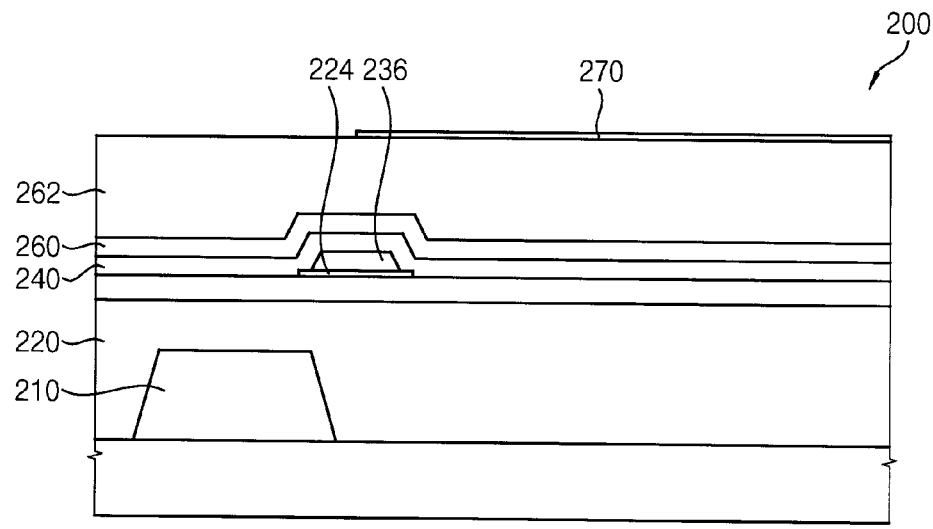
FIG. 13 is a cross-sectional view taken along the line VII-VII' of FIG. 9.

FIG. 9 is a plan view illustrating a display panel according to another exemplary embodiment of the present invention. FIG. 10 is a cross-sectional view taken along the line IV-IV' of FIG. 9. FIG. 11 is a cross-sectional view taken along the line V-V' of FIG. 9. FIG. 12 is a cross-sectional view taken along the line VI-VI' of FIG. 9. FIG. 13 is a cross-sectional view taken along the line VII-VII' of FIG. 9.

Referring to FIGS. 9 to 13, a display panel 200 includes a base substrate 202, a data line 210, a gate electrode 212, a planarization layer 220, a gate insulation layer 222, an active layer 224, a lower gate line 230, a source electrode 232, a drain electrode 234, a storage electrode 236, a first passivation layer 240, an upper gate line 250, a first connecting member 252, a second connecting member 254, a second passivation layer 260, and a pixel electrode 270.

The base substrate 202 may have a planar shape provide an optically transparent property. The base substrate 202 may include a glass substrate or a plastic substrate.

The data line 210 is formed on a base substrate 202 and extends in a first direction D1.

The gate electrode 212 is formed on the base substrate 202 in an island shape and is spaced apart from the data line 210. The gate electrode 212 is formed from the data line 210 when the data line 210 is formed. The data line 210 and the gate electrode 212 may include an electrically conductive metal. The data line 210 and the gate electrode 212 may include at least one of aluminum (Al), copper (Cu), molybdenum (Mo), neodymium (Nd), titanium (Ti), platinum (Pt), silver (Ag), niobium (Nb), chrome (Cr), manganese (Mn), tungsten (W), and tantalum (Ta), and the like, and may be formed to have a single layer or a multi-layered structure. In the present exemplary embodiment, the data line 210 and the gate electrode 212 are simultaneously formed, so that a thickness of the gate electrode 212 is substantially equal to a thickness of the data line 210.

Generally, a data line is formed on a layer different from where a gate line or a gate electrode is formed, and a thickness of the gate line is greater a thickness of the data line. However, according to the present exemplary embodiment, the data line 210 is formed as a layer identical to the gate electrode 212, so that the thickness of the data line 210 is substantially equal to the thickness of the gate electrode 212. Thus, the thickness of the data line 210 is greater than the thickness of a conventional data line, thereby decreasing a load value of the data line 210.

A distance between a conventional data line and a liquid crystal layer is substantially less than a distance between a conventional gate line or a conventional gate electrode and a liquid crystal layer. Thus, a parasitic capacitance may be generated between a common electrode formed on an upper plate and a data line. However, according to the present exemplary embodiment, the data line is formed on the same layer as the gate electrode. That is, according to the present exemplary embodiment, a distance between a common electrode formed on an upper plate and a data line is greater than a distance between a conventional data line and a common electrode. Accordingly, in the present exemplary embodiment, a parasitic capacitance generated between a data line and a common electrode is less than a parasitic capacitance generated between a conventional data line and a common electrode. Thus, a data line load may be reduced.

The planarization layer 220 is formed to cover the data line 210 and the gate electrode 212, and the gate insulation layer 222 is formed on the planarization layer 220. A first opening OPP1 exposing a portion of the gate electrode 212 and a second opening OPP2 exposing a portion of the data line 210 are formed through the planarization layer 220 and the gate insulation layer 222.

The active layer 224 is formed on the gate insulation layer 222. For example, an oxide semiconductor material is formed on the gate insulation layer 222, and then the oxide semiconductor material is patterned to form an active layer 224 of an oxide semiconductor. In this case, the active layer 224 is overlapped with at least a portion of the gate electrode 212 while interposing the gate insulation layer 222 therebetween.

The active layer 224 may be formed by patterning a thin-film of an oxide semiconductor. In this case, the patterning may be performed by one of a wet etching process and a dry etching process. In order to obtain a uniform thickness of the active layer 224, a dry etching process having anisotropy may be performed.

The active layer 224 may include an oxide semiconductor. The oxide semiconductor may include amorphous silicon, micro-crystallized silicon, single crystallized silicon, or mixtures thereof. The oxide semiconductor may include oxygen (O) and at least one of zinc (Zn), cadmium (Cd), gallium (Ga), indium (In), tin (Sn), hafnium (Hf), and zirconium (Zr). In this case, an empirical formula of the oxide semiconductor may be $A_xB_yC_zO$ (x, y, z≥0) (here, A, B and C are selected from Zn, Cd, Ga, In, Sn, Hf and Zr). Examples of the oxide semiconductors including at least one of the above-described materials may include ZnO, $InGaZnO_4$, ZnInO, ZnSnO, InZnHfO, SnInO, SnO, and ZnSnHfO, but it is not limited thereto.

The lower gate line 230, the source electrode 232, the drain electrode 234, and the storage electrode 236 are formed on the gate insulation layer 222. The lower gate line 230, the source electrode 232, the drain electrode 234 and the storage electrode 236 may include a metal having an electrically conductive material. The lower gate line 230, the source electrode 232, the drain electrode 234, and the storage electrode 236 may include at least one of aluminum (Al), copper (Cu), molybdenum (Mo), neodymium (Nd), titanium (Ti), platinum (Pt), silver (Ag), niobium (Nb), chrome (Cr), manganese (Mn), tungsten (W), or tantalum (Ta), and the like, and may be made in a single layer or a multi-layered structure.

The lower gate line 230 is formed along a second direction D2. The second direction D2 may cross the first direction D1. In the present exemplary embodiment, the display panel 200 may have a pixel structure of one gate line and two data lines ("1G2D"). That is, two thin-film transistors and two pixel electrodes are formed in correspondence with one gate line and two data lines. When viewed on a plane, an upper pixel is formed on an upper portion of the lower gate line 230, and a lower pixel is formed on a lower portion of the lower gate line 230.

The source electrode 232 is formed from the lower gate line 230 in an island shape to be connected to the data line 210 through the second connecting member 254.

The drain electrode 234 is formed from the lower gate line 230 in an island shape to be connected to the pixel electrode 270.

The storage electrode 236 is formed along an edge of a pixel area. In the present exemplary embodiment, there are two storage electrodes 236. That is, when viewed on a plan view, a first storage electrode is formed in correspondence with an upper area of the lower gate line 230, and a second storage electrode is formed in correspondence with a lower area of the lower gate line 230.

The first passivation layer 240 covers the gate line. A first opening OPP1 exposing the gate electrode 212 and a second opening OPP2 exposing the data line 210 are formed through the first passivation layer 240.

The upper gate line 250 is formed to cover the lower gate line 230 along a second direction D2.

The upper gate line 250 may include a metal having an electrically conductive material. The upper gate line 250 may include at least one material of aluminum (Al), copper (Cu), molybdenum (Mo), neodymium (Nd), titanium (Ti), platinum (Pt), silver (Ag), niobium (Nb), chrome (Cr), manganese (Mn), tungsten (W), or tantalum (Ta), and the like, and may be made in a single layer or a multi-layered structure.

A first end of the first connecting member 252 is connected to the gate electrode 212 through a first opening OPP1 formed through the gate insulation layer 222 and the planarization layer 220, and a second end portion of the first connecting member 252 is connected to the gate line. The first connecting member 252 may be formed thereon when the upper gate line 250 is formed thereon. Alternatively, the first connecting member 252 may be formed in an additional transparent electrode.

A first end portion of the second connecting member 254 is connected to the data line 210 through a second opening OPP2 formed through the gate insulation layer 222 and the planarization layer 220, and a second end portion of the second connecting member 254 is connected to the source electrode 232. The second connecting member 254 may be formed thereon when the upper gate line 250 is formed thereon. Alternatively, the second connecting member 254 may be formed in an additional transparent electrode.

The pixel electrode 270 is connected to the drain electrode 234. The pixel electrode 270 may be patterned in various shapes.

A second passivation layer 260 and a color filter layer 262 are sequentially further formed on the first and second connecting members 254. The pixel electrode 270 may be formed on the color filter layer 262.

As described above, according to the present exemplary embodiment, the gate line 212 is formed in the same layer as the data line 210 and the gate line is configured in double layers (that is, a lower gate line 230 and an upper gate line 250), so that a load of a data line, a load of a gate line, and a resistance of a gate electrode may all be reduced. Thus, a capacitance load may be reduced, thereby preventing a reduction in display quality even though a size of a display panel has been increased.

FIGS. 14A to 14F are plan views illustrating a manufacturing method of the thin-film transistor shown in FIG. 9. FIGS. 15A to 15F are cross-sectional views illustrating a manufacturing method of the thin-film transistor shown in FIG. 9.

Figure 14B:
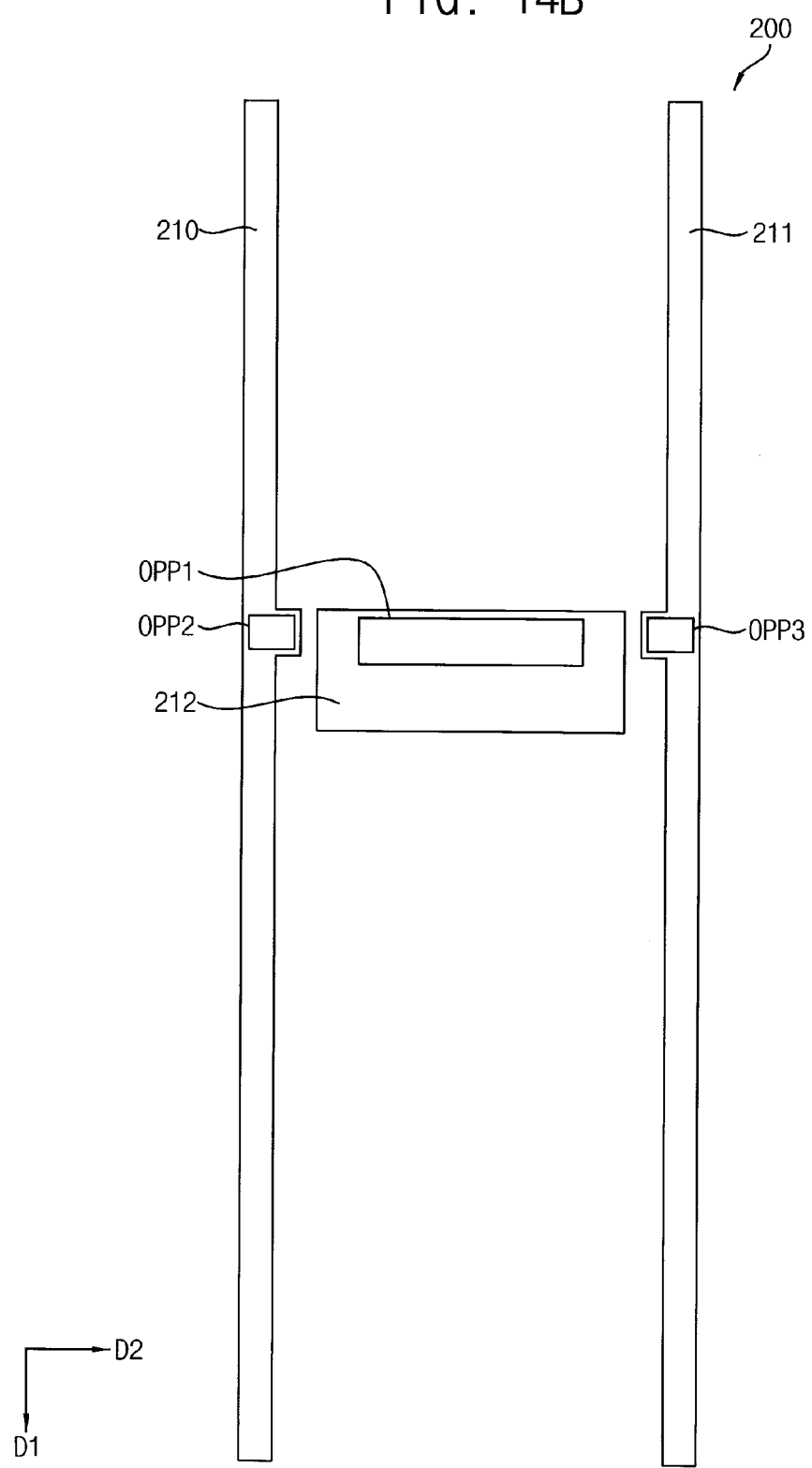
Figure 15A:
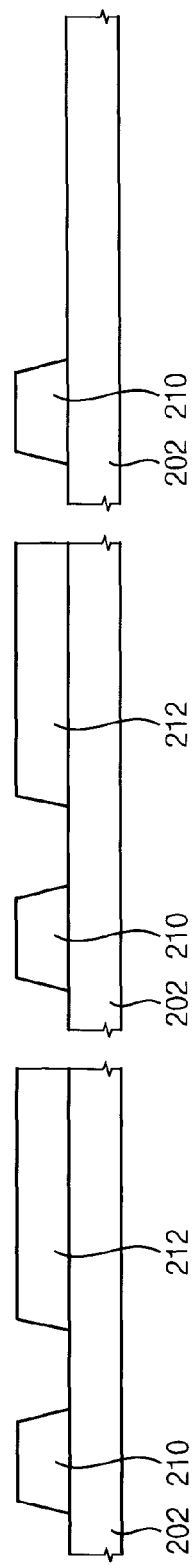
FIG. 15A, FIG. 15B, FIG. 15C, FIG. 15D, FIG. 15E, and FIG. 15F are cross-sectional views illustrating a manufacturing method of the thin-film transistor shown in FIG. 9.

Referring to FIGS. 14A and 15A, a first metal layer is deposited on a base substrate 202 via a sputtering process, and then the first metal layer is patterned through a photolithography process to form a data line 210, a second data line 211, and a gate electrode 212 between the first and second data lines 210 and 211. In the photolithography process, a photoresist is formed on a base substrate 202, a light exposure is performed in a desired pattern by using an exposing device, and alkaline solution is used to etch away the first metal layer to form the desired pattern.

Figure 15B:
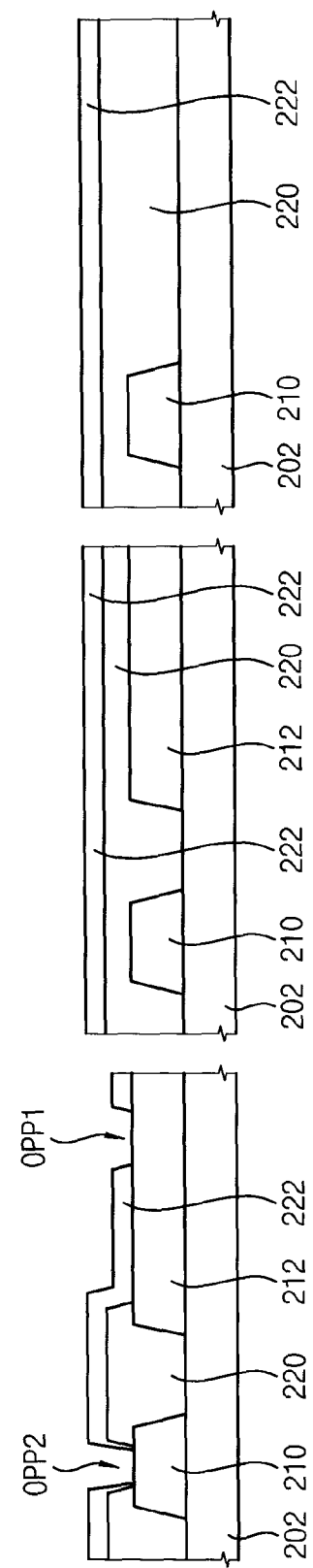

Referring to FIGS. 14B and 15B, a planarization layer 220 is coated on the base substrate 202 on which the first and second data lines 210 and 211 and the gate electrode 212 are formed. Then, a first opening OPP1, a second opening OPP2, and a third opening OPP3 are formed through the planarization layer 220 by using an optical mask in order to expose a portion of the gate electrode 212, and then a gate insulation layer 222 is formed. The planarization layer 220 may include an organic layer. Alternatively, the planarization layer 220 may include a material identical to the gate insulation layer 222.

The planarization layer 220 may be a negative photosensitive organic layer. When the planarization layer 220 includes a negative photosensitive organic layer, the optical mask may include a light-blocking portion blocking lights and a light-transmitting portion transmitting lights. The light-blocking portion may be positioned at a portion of the gate electrode 212.

Meanwhile, the planarization layer 220 may be a positive photosensitive organic layer. When the planarization layer 220 includes a positive photosensitive organic layer, the optical mask may include a light-blocking portion for blocking light and a light-transmitting portion for transmitting light. The light-transmitting portion may be positioned at a portion of the gate electrode 212.

In addition, a heat processing may be performed after the first to third openings OPP1, OPP2, and OPP3 are formed through the planarization layer 220. The heat process may be performed at about 200 degrees Celsius to about 230 degrees Celsius for about a half hour to one hour.

Figure 14C:
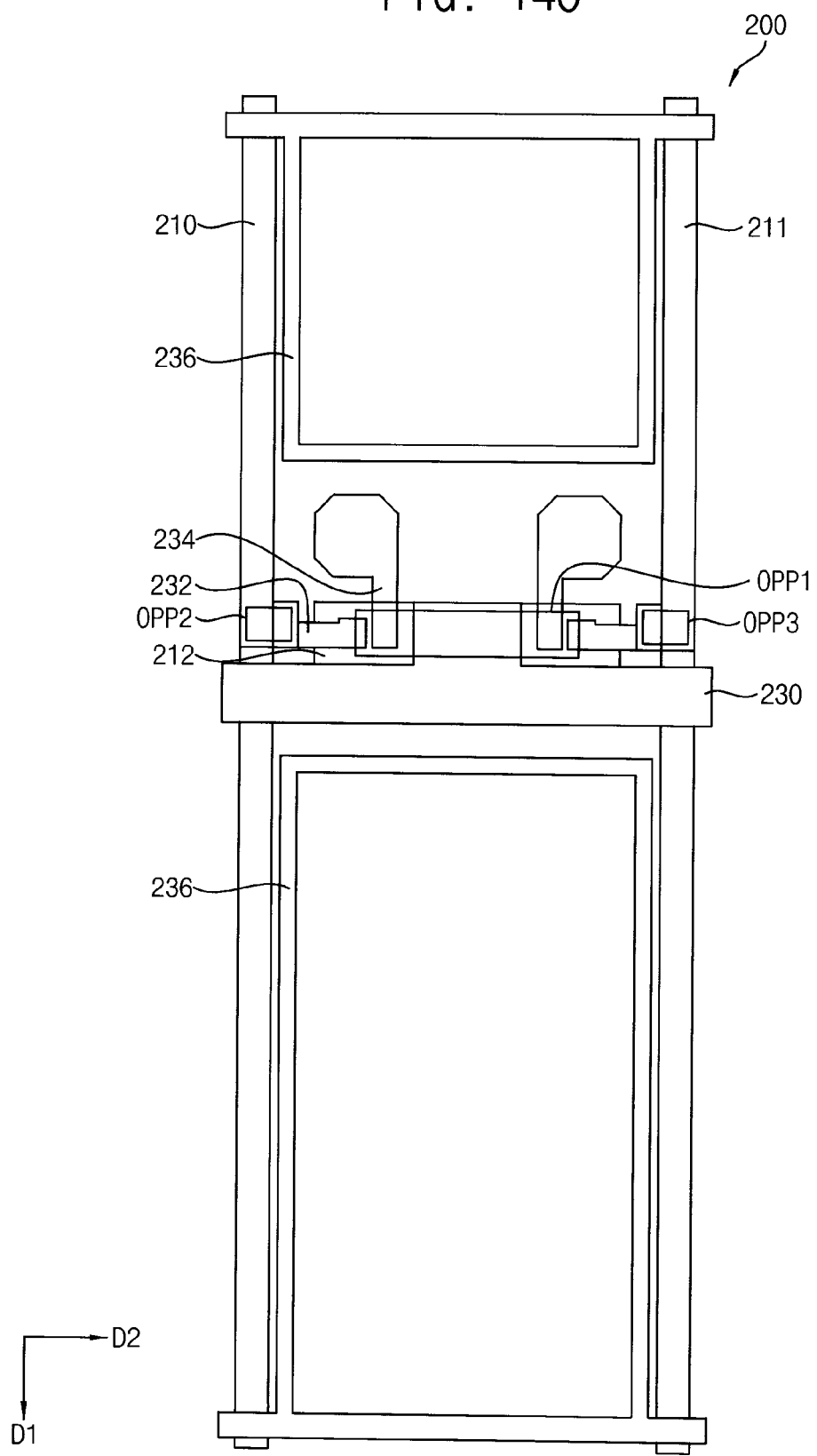
Figure 15C:
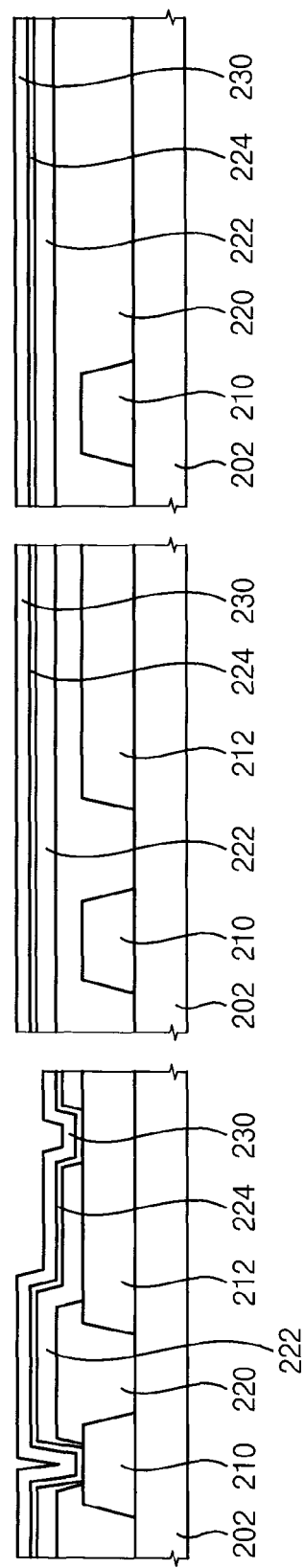

Referring to FIGS. 14C and 15C, an active layer 224 and a second metal layer are formed. The active layer 224 and the second metal layer are patterned to form a lower gate line 230 in parallel with a second direction, a source electrode 232 spaced apart from the lower gate line 230, a drain electrode 234 spaced apart from the source electrode 232, and a storage electrode 236 between the data lines 210 adjacent to each other. The active layer 224 may be formed to cover the entire surface of the gate insulation layer 222. Alternatively, the active layer 224 may be formed only in an area where it operates as an active layer 224 of a thin-film transistor.

Figure 14D:
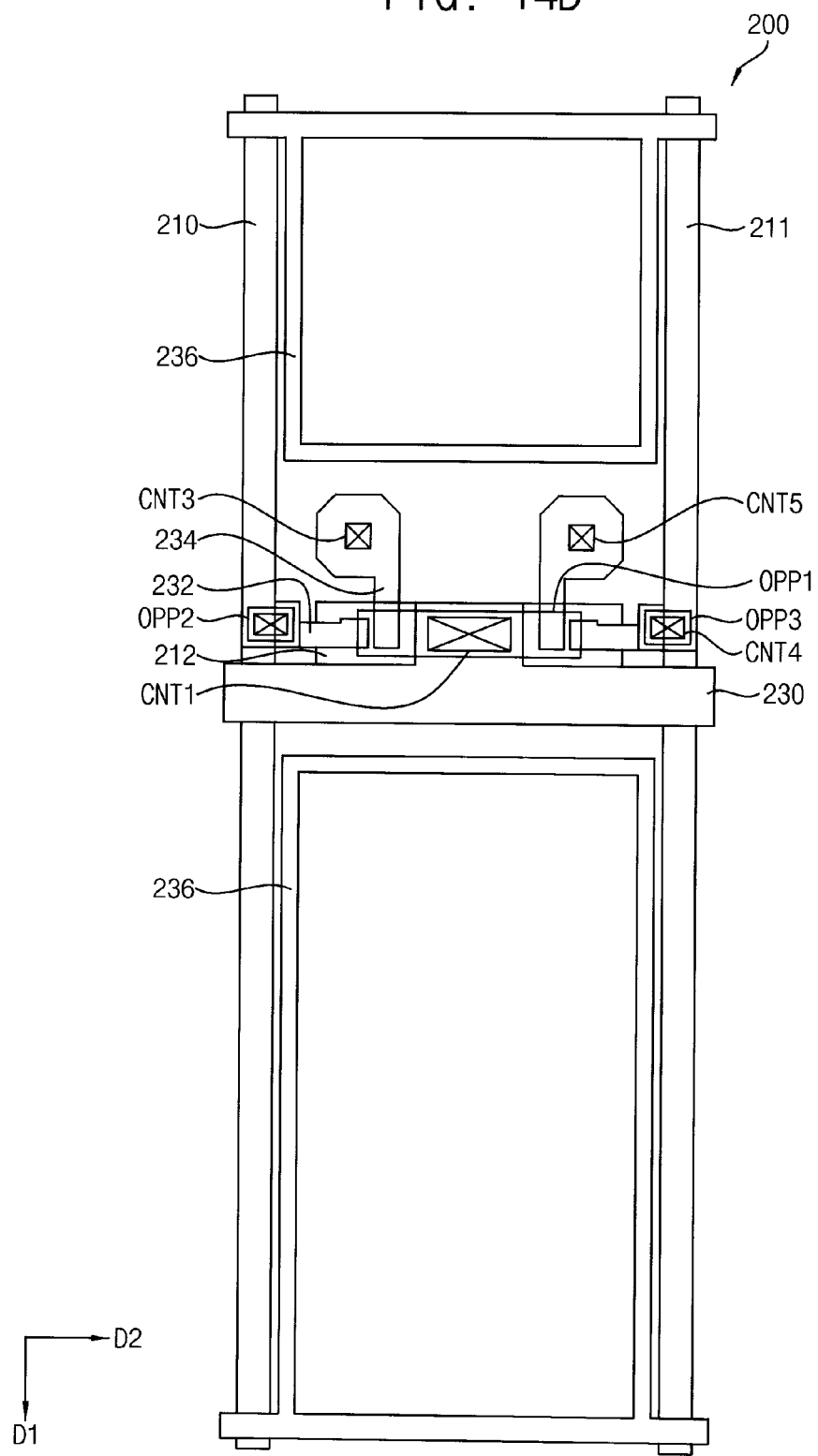
Figure 15D:
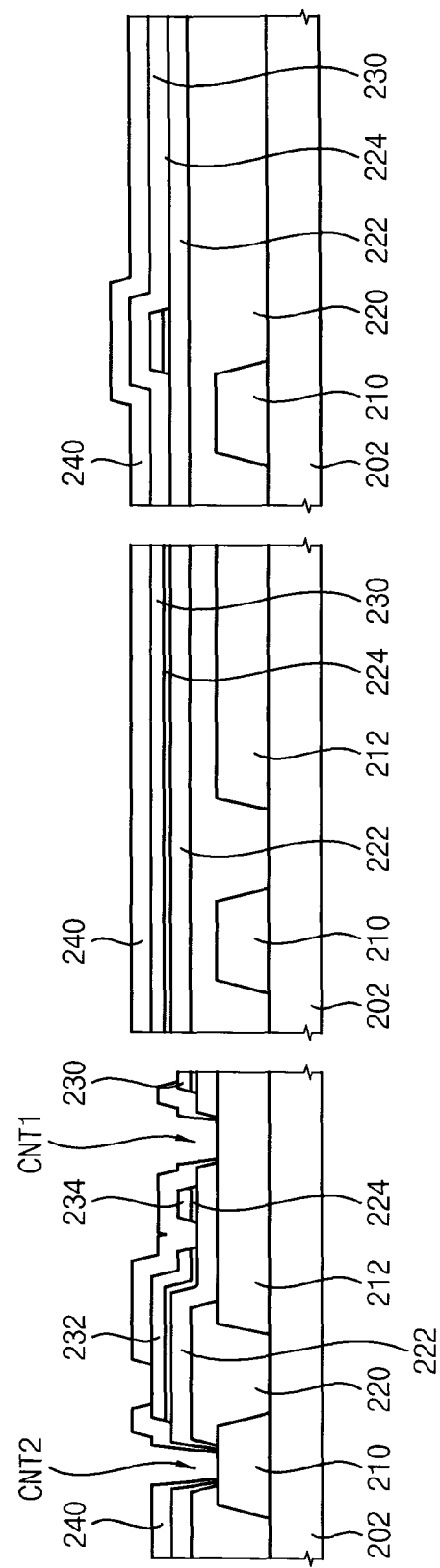

Referring to FIGS. 14D and 15D, a first passivation layer 240 is formed on the lower gate line 230, the source electrode 232, the drain electrode 234, and the storage electrode 236, and then a first contact hole CNT1, a second contact hole CNT2, a third contact hole CNT3, a fourth contact hole CNT4, and a fifth contact hole CNT5 are formed therethrough. The first passivation layer 240 may include silicon oxide ($SiO_x$) or silicon nitride ($SiN_x$), although other suitable insulation layers would also be within the scope of these exemplary embodiments. The first contact hole CNT1 exposes the gate electrode 212, the second contact hole CNT2 exposes the first data line 210, the third contact hole CNT3 exposes a pattern extended from the drain electrode 234 of a thin-film transistor formed in correspondence with the first data line 210. The fourth contact hole CNT4 exposes the second data line 211, and the fifth contact hole CNT5 exposes a pattern extended from the drain electrode of the thin-film transistor formed to correspond to the second data line 211.

Figure 14E:
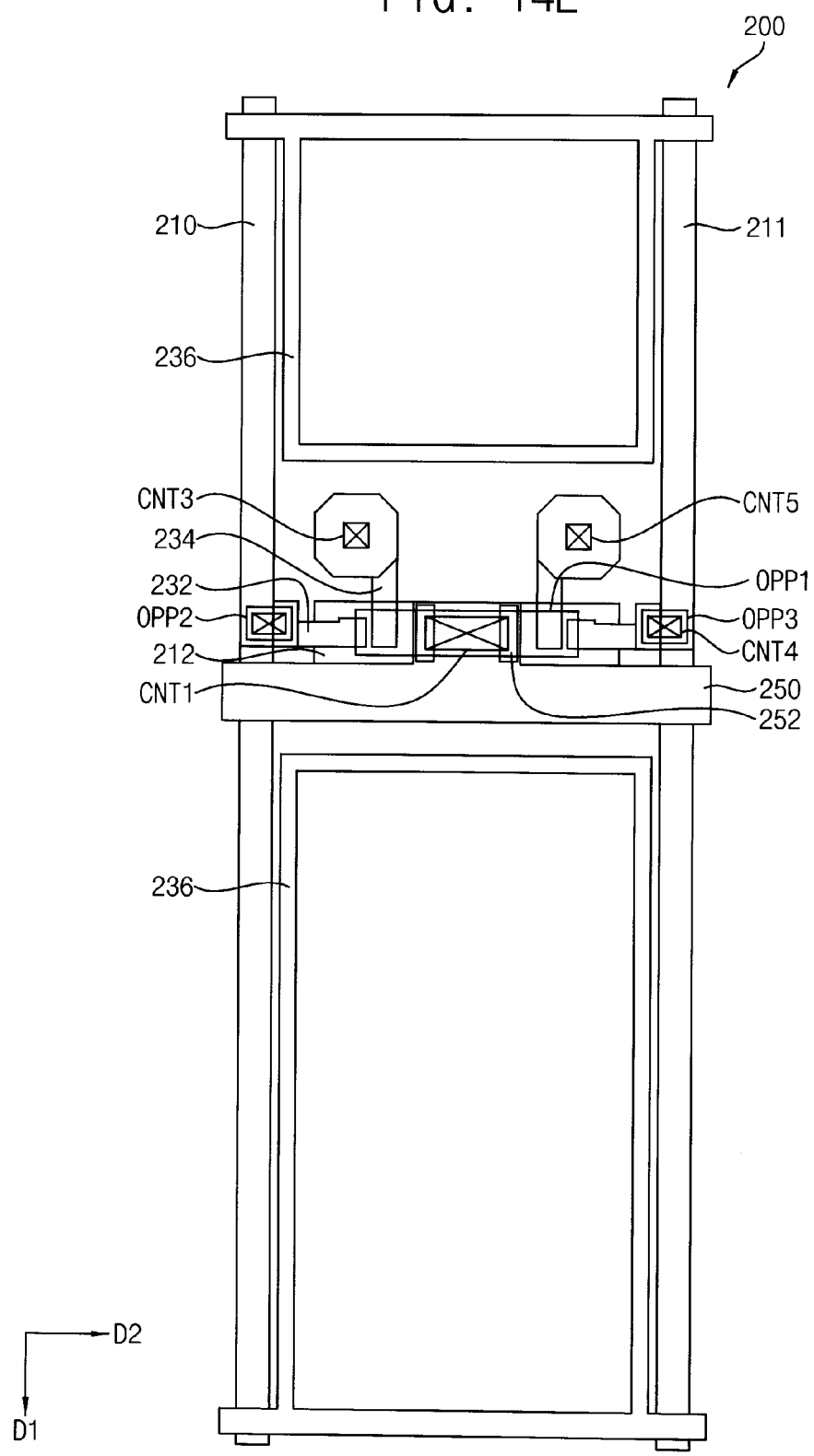
Figure 15E:
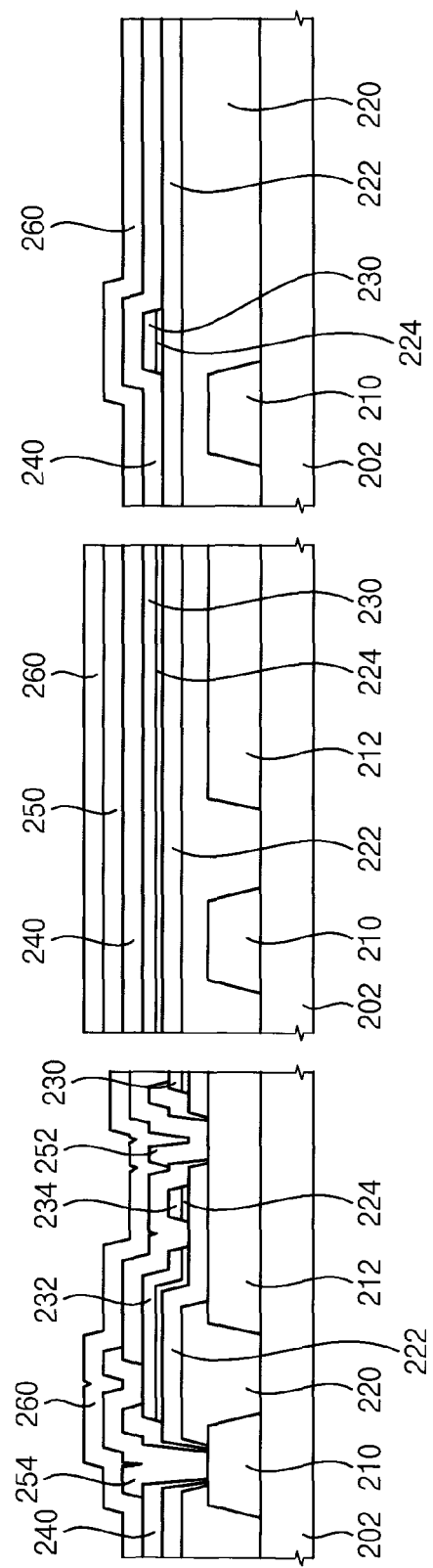

Referring to FIGS. 14E and 15E, a third metal layer is formed, the third metal layer is patterned to form an upper gate line 250, a first connecting member 252, and a second connecting member 254, and then a second passivation layer 260 is formed. The upper gate line 250 is disposed on the first passivation layer in parallel with a second direction to cover the lower gate line 230. The first connecting member 252 connects to the data line 210 exposed by the first opening OPP1 (or the first contact hole CNT1) and the source electrode 232. The second connecting member 254 connects to the gate line 212 exposed by the second opening OPP2 (or the second contact hole CNT2) and the lower gate line 230. The second passivation layer 260 may include silicon oxide ($SiO_x$) or silicon nitride ($SiN_x$), although other suitable insulation layers would also be within the scope of these embodiments.

Figure 14F:
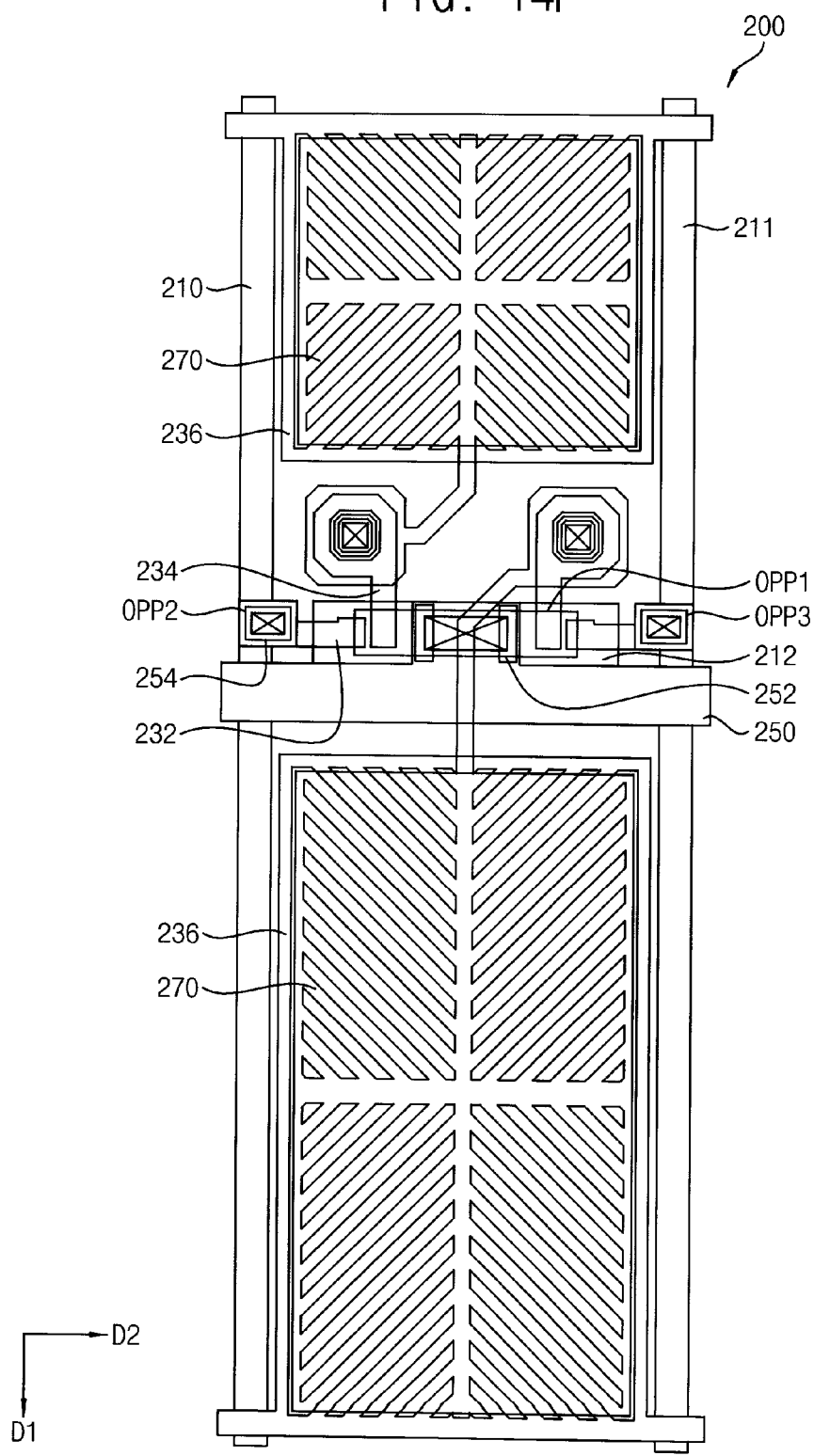
Figure 15F:
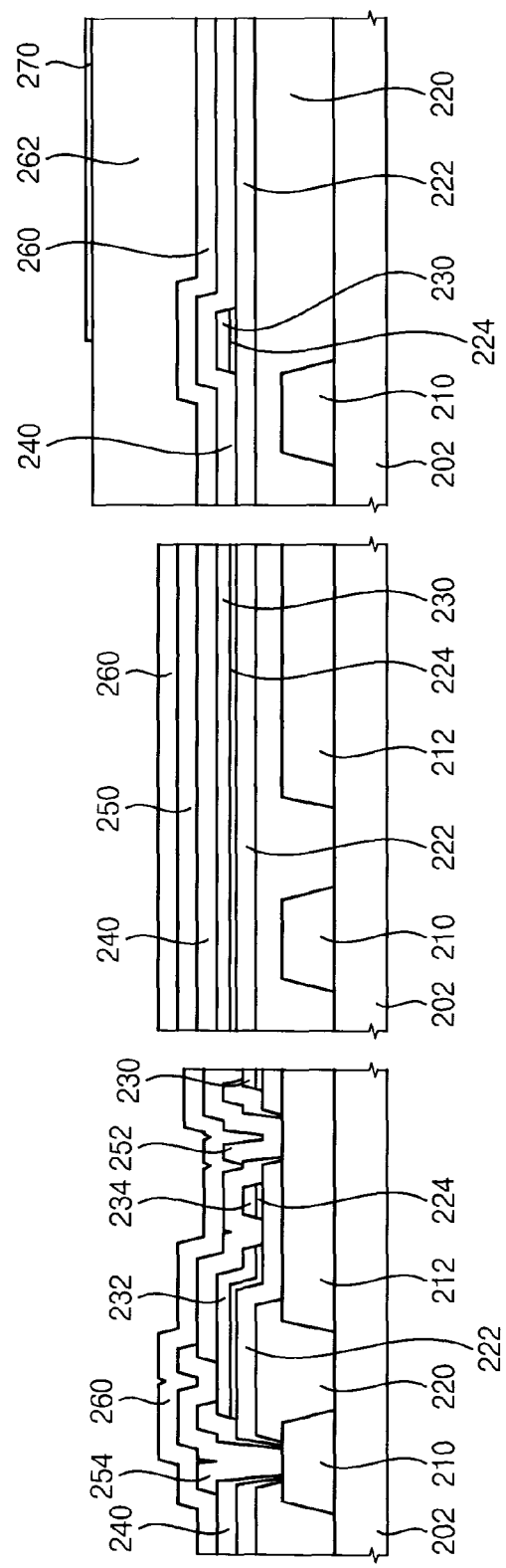

Referring to FIGS. 14F and 15F, a color filter layer 262 is formed, and then a pixel electrode 270 connected to a drain electrode 234 is formed. Description of the color filter layer 262 is omitted in FIG. 14F. Various known techniques for connecting the pixel electrode 270 and the drain electrode 234 may be utilized, and thus a detailed description thereof is omitted here.

In the present exemplary embodiment, a color filter layer is formed on an array substrate on which thin-film transistors are formed. Alternatively, the color filter layer may be formed on an opposition substrate opposite to the array substrate.

As described above, according to the present exemplary embodiment, a gate line is formed in the same layer as a data line and a gate line is configured in double layers, so that a load of a data line, a load of a gate line, and a resistance of a gate electrode may all be reduced. Thus, a capacitance load may be reduced, so that reduction in display quality may be prevented from being reduced, even though a size of a display panel has been increased.

As described above, according to the present exemplary embodiment, a planarization layer is formed in an area where a gate electrode and a portion of a source electrode are overlapped with each other, so that a parasitic capacitance generated by overlapping of the data electrode and the source electrode is reduced, thereby reducing a load of a gate line and a load of a data line. A planarization layer is formed in an area where a gate electrode and a portion of a drain electrode are overlapped with each other, so that a parasitic capacitance generated by overlapping of the gate electrode and the drain electrode is reduced, thereby reducing a load of a gate line.

A gate line and a data line are formed on the same layer and a gate line is configured in double layers, thereby resulting in a reduction of a load of a data line, a load of a gate line, and a resistance of a gate electrode. Thus, a capacitance load may be reduced, resulting in a prevention of reduction in display quality, even though a size of a display panel has been increased.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
    a gate line disposed on a substrate and extending in a first direction;
    a gate electrode extending from the gate line;
    a planarization layer covering the gate line and the gate electrode and comprising an opening exposing a portion of the gate electrode, wherein the planarization layer has a first thickness over the gate electrode and a second thickness spaced apart from the gate electrode in a plan view, and wherein the first thickness is less than the second thickness, such that the planarization layer has a flat upper surface over a boundary of the gate electrode;
    a gate insulation layer covering the planarization layer and the portion of the gate electrode exposed by the opening in the planarization layer;
    an active layer disposed on the gate insulation layer and corresponding to the gate electrode;
    a data line disposed on the substrate and extending in a second direction;
    a source electrode extending from the data line and covering a portion of the opening;
    a drain electrode spaced apart from the source electrode and covering a portion of the opening; and
    a pixel electrode connected to the drain electrode.

2. The display panel of claim 1, wherein:
    the opening is substantially smaller than a portion of the active layer overlapped with the gate electrode; and
    the size of a first overlap area between the source electrode and the portion of the active layer disposed in the opening is substantially equal to a size of a second overlap area between the drain electrode and the portion of the active layer disposed in the opening.

3. The display panel of claim 1, wherein:
    the size of the opening is substantially equal to the size of the portion of the active layer overlapped with the gate electrode; and
    the size of a first overlap area between the source electrode and portion of the active layer disposed in the opening is substantially smaller than a size of a second overlap area between the drain electrode and the active layer disposed in the opening.

4. The display panel of claim 1, wherein:
    the size of the opening is substantially greater than the size of the portion of the active layer overlapped with the gate electrode; and
    the size of a first overlap area between the source electrode and portion of the active layer disposed in the opening is substantially equal to a size of a second overlap area between the drain electrode and the active layer disposed in the opening.

5. A method of manufacturing a display panel, the method comprising:
    forming a gate line and a gate electrode on a substrate, the gate line extending in a first direction and the gate electrode extending from the gate line;
    forming a planarization layer covering the gate line and the gate electrode, wherein the planarization layer has a first thickness over the gate electrode and a second thickness spaced apart from the gate electrode in a plan view, and wherein the first thickness is less than the second thickness, such that the planarization layer has a flat upper surface over a boundary of the gate electrode, the planarization layer comprising an opening exposing a portion of the gate electrode;
    forming a gate insulation layer on the planarization layer;
    forming an active layer on the gate insulation layer corresponding to the gate electrode;
    forming a data line, a drain electrode, and a source electrode on the substrate, the data line extending in a second direction, the source electrode extending from the data line and covering a portion of the opening, and the drain electrode spaced apart from the source electrode and covering a portion of the opening; and
    forming a pixel electrode connected to the drain electrode.

6. The method of claim 5, wherein:
    the size of the opening is substantially smaller than the size of the portion of the active layer overlapped with the gate electrode; and
    the size of a first overlap area between the source electrode and the portion of the active layer disposed in the opening is substantially equal to the size of a second overlap area between the drain electrode and the portion of the active layer disposed in the opening.

7. The method of claim 5, wherein:
    the size of the opening is substantially equal to the size of the portion of the active layer overlapped with the gate electrode; and
    a size of a first overlap area between the source electrode and the portion of the active layer disposed in the opening is substantially smaller than the size of a second overlap area between the drain electrode and the portion of the active layer disposed in the opening.

8. The method of claim 5, wherein:
    the size of the opening is substantially greater than a size of the portion of the active layer overlapped with the gate electrode; and
    the size of a first overlap area between the source electrode and the portion of the active layer disposed in the opening is substantially equal to the size of a second overlap area between the drain electrode and the portion of the active layer disposed in the opening.

9. A display panel comprising:
    a data line disposed on a substrate and extending in a first direction;
    a gate electrode disposed on the substrate and spaced apart from the data line;
    a planarization layer covering the data line and the gate electrode and comprising a first opening exposing a portion of the gate electrode and a second opening exposing a portion of the data line;
a gate insulation layer disposed on the planarization layer;
an active layer disposed on the gate insulation layer;
a lower gate line disposed on the gate insulation layer and extending in a second direction different from the first direction;
a source electrode disposed on the active layer and spaced apart from the lower gate line;
a drain electrode disposed on the active layer and spaced apart from the source electrode;
a storage electrode disposed between the data lines adjacent to each other when viewed from a plan view;
a first passivation layer disposed on the lower gate line, the source electrode, the drain electrode, and the storage electrode;
an upper gate line disposed on the first passivation layer in the second direction and covering the lower gate line;
a first connecting member connecting the data line and the source electrode exposed by the first opening;
a second connecting member connecting the gate electrode and the lower gate line exposed by the second opening; and
a pixel electrode connected to the drain electrode.

10. The display panel of claim 9, further comprising a color filter layer disposed between the first and second connecting members and the pixel electrode.

11. The display panel of claim 10, further comprising a second passivation layer disposed between the first and second connecting members and the color filter layer.

12. The display panel of claim 9, wherein the first and second connecting members comprise an optically transparent and electrically conductive material.

13. The display panel of claim 9, wherein the first and second connecting members comprise a material identical to the upper gate line.

14. A method of manufacturing a display panel, the method comprising:
forming a data line and a gate electrode on a substrate, the data line extending in a first direction and spaced apart from the gate electrode;
forming a planarization layer covering the data line and the gate electrode, the planarization layer comprising a first opening exposing a portion of the gate electrode and a second opening exposing a portion of the data line;
forming a gate insulation layer on the planarization layer;
forming an active layer on the gate insulation layer;
forming a lower gate line on the gate insulation layer in a second direction;
forming a source electrode on the active layer and spaced apart from the lower gate line;
forming a drain electrode on the active layer and spaced apart from the source electrode;
forming a storage electrode between the data lines adjacent to each other when viewed from a plan view;
forming a first passivation layer on the lower gate line, the source electrode, the drain electrode, and the storage electrode;
forming an upper gate line disposed on the first passivation layer in the second direction and covering the lower gate line;
forming a first connecting member connecting the data line and the source electrode exposed by the first opening;
forming a second connecting member connecting the gate electrode and the lower gate line exposed by the second opening; and
forming a pixel electrode connected to the drain electrode.

15. The method of claim 14, further comprising forming a color filter layer after the first and second connecting members are formed.

16. The method of claim 14, wherein the first and second connecting members comprise an optically transparent and electrically conductive material.

17. The method of claim 14, wherein the first and second connecting members comprise a material identical to the upper gate line.

18. The method of claim 17, wherein the first and second connecting members are formed thereon when the upper gate line is formed.

* * * * *